(12) United States Patent
Wodrich et al.

(10) Patent No.: US 11,886,654 B2
(45) Date of Patent: *Jan. 30, 2024

(54) COMPACT HOME ASSISTANT DEVICE

(71) Applicant: Google LLC, Mountain View, CA (US)

(72) Inventors: Justin Richard Wodrich, Los Gatos, CA (US); Timothy Michael Vanderet, Berkeley, CA (US); Daniel David Sachs, Sunnyvale, CA (US); Jung Geun Tak, Millbrae, CA (US); Laurie Kwan, San Francisco, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/964,319

(22) Filed: Oct. 12, 2022

(65) Prior Publication Data
US 2023/0110645 A1 Apr. 13, 2023

Related U.S. Application Data

(63) Continuation of application No. 17/362,469, filed on Jun. 29, 2021, now Pat. No. 11,494,026, which is a (Continued)

(51) Int. Cl.
G06F 3/041 (2006.01)
G06F 3/16 (2006.01)

(52) U.S. Cl.
CPC ............ G06F 3/0416 (2013.01); G06F 3/167 (2013.01)

(58) Field of Classification Search
CPC .......... G06F 3/167; G06F 3/16; G06F 3/0416; G06F 1/1658; G06F 9/453; G06F 3/044;
(Continued)

(56) References Cited

U.S. PATENT DOCUMENTS 5,828,012 A * 10/1998 Repolle .................. H04R 1/023
181/175
6,327,144 B1 12/2001 May
(Continued)

FOREIGN PATENT DOCUMENTS

CN 103139673 6/2013
EP 3068202 9/2016
(Continued)

OTHER PUBLICATIONS

Parsons, Jeff. "New Manta X7 smartphone has no physical buttons." Techradar, Dec. 4, 2014, 2 pages.
(Continued)

*Primary Examiner* — Koosha Sharifi-Tafreshi
(74) *Attorney, Agent, or Firm* — Kilpatrick Townsend & Stockton LLP

(57) ABSTRACT

Various arrangements of electronic devices, such as assistant devices, are detailed herein. Such a device can include a housing and a microphone. A microphone aperture can be defined by the housing that directs sound from outside the housing to the microphone. A cover, which can be fabric, can be attached with the outside of the housing. An adhesive ring on the housing around the microphone aperture can be used to attach the cover to the housing.

20 Claims, 14 Drawing Sheets

Related U.S. Application Data continuation of application No. 16/898,252, filed on Jun. 10, 2020, now Pat. No. 11,079,875.

(60) Provisional application No. 62/878,269, filed on Jul. 24, 2019.

(58) Field of Classification Search
CPC ........ G10K 11/18; G10K 11/26; G10K 11/22; H04R 1/323; H04R 1/345; H04R 2201/00; H04R 2203/00; H04R 2400/00; H04R 2420/07; H04R 3/00; H04R 1/34; H04R 9/06; H04R 1/026; H04R 1/025; H04R 1/02; H04R 1/00; H04R 1/326; H04R 1/08; B81B 2201/0257; H03K 2217/960755; H03K 2217/96076; H03K 17/962; G10L 15/22; G10L 2015/223
See application file for complete search history.

(56) References Cited

U.S. PATENT DOCUMENTS

| | | | |
|---|---|---|---|
| 7,092,745 | B1 | 8/2006 | D'Souza |
| D596,159 | S | 7/2009 | Yamaji |
| D676,423 | S | 2/2013 | Joseph |
| D778,871 | S | 2/2017 | Corval |
| 9,712,902 | B1 | 7/2017 | Uziel et al. |
| D797,704 | S | 9/2017 | Fischer |
| 9,769,929 | B1 | 9/2017 | Stanley et al. |
| D828,330 | S | 9/2018 | Nylen |
| 10,979,810 | B2* | 4/2021 | Mata Magana ......... H04R 5/02 |
| 11,079,875 | B2 | 8/2021 | Wodrich et al. |
| 2005/0233781 | A1 | 10/2005 | Erixon et al. |
| 2007/0103451 | A1 | 5/2007 | Heimann et al. |
| 2007/0109763 | A1 | 5/2007 | Wolf et al. |
| 2008/0087329 | A1 | 4/2008 | Chin et al. |
| 2009/0027356 | A1* | 1/2009 | Heimann ............. H03K 17/962 345/174 |
| 2009/0196016 | A1 | 8/2009 | Massara et al. |
| 2011/0255728 | A1 | 10/2011 | Abe et al. |
| 2011/0317846 | A1 | 12/2011 | Yuan et al. |
| 2012/0039491 | A1 | 2/2012 | Katz |
| 2013/0028457 | A1 | 1/2013 | Yeh et al. |
| 2014/0233756 | A1* | 8/2014 | Inoda ...................... H04R 1/38 381/91 |
| 2014/0274211 | A1* | 9/2014 | Sejnoha .................. G10L 17/22 455/563 |
| 2014/0278435 | A1 | 9/2014 | Ganong, III et al. |
| 2015/0237847 | A1* | 8/2015 | Madl .................... A01M 31/004 367/139 |
| 2016/0007495 | A1 | 1/2016 | McKittrick |
| 2016/0255437 | A1 | 9/2016 | Wen et al. |
| 2017/0208379 | A1 | 7/2017 | Uziel et al. |
| 2017/0329573 | A1 | 11/2017 | Mixter |
| 2018/0103307 | A1* | 4/2018 | Hansson ................ H04R 1/086 |
| 2018/0190285 | A1 | 7/2018 | Heckman et al. |
| 2018/0220213 | A1 | 8/2018 | Wu et al. |
| 2019/0026056 | A1 | 1/2019 | Wang et al. |
| 2019/0212843 | A1 | 7/2019 | Reese et al. |
| 2019/0259385 | A1 | 8/2019 | Heckmann et al. |
| 2020/0221219 | A1* | 7/2020 | Hardin .................. H04N 23/51 |
| 2021/0006876 | A1* | 1/2021 | Moon .................... H04R 1/345 |
| 2021/0026487 | A1 | 1/2021 | Wodrich et al. |
| 2021/0027776 | A1 | 1/2021 | Wordrich et al. |

FOREIGN PATENT DOCUMENTS

| | | |
|---|---|---|
| GB | 2 504 723 | 2/2014 |
| JP | 3-211796 | 9/1991 |
| JP | 2016524410 | 8/2016 |
| JP | 2018525653 | 9/2018 |
| WO | 2016045120 | 3/2016 |
| WO | 2017197184 | 11/2017 |

OTHER PUBLICATIONS

"Two waterproof Bluetooth speakers that pursue the JBL sound will be released in sequence," Harman International Industries, Incorporated, Press Release [online], Jun. 2, 2016, 5 pages. Retrieved from https://prtimes.jp/a/?c=127678&r=57&f=d12767-57-pdf-0.pdf.

"Look inside of JBL Clip2—Teardown," YouTube, MegaSafetyFirst, Dec. 24, 2016, www.youtube.com/watch?v=sBOUns3GBhl&feature=emb_logo. (Year: 2016), 1 page.

"IHome iDM8 portable rechargeable Bluetooth speaker instruction manual," SDI Technologies, 2012 (Year: 2012), 15 pages.

"JBL Clip2 Quick Start Guide," Harman May 2016 (Year: 2016) 16 pages.

"Google Home Mini Review: Chasing Dots," The Verge, edited by Dan Seifert, Oct. 11, 2017, www.theverge.com/2017/10/11/16453788/google-home-mini-smart-speaker-review. (Year: 2017) 12 pages.

Extended European Search Report for EP 23175740.2 dated Jun. 27, 2023, 9 pages.

* cited by examiner

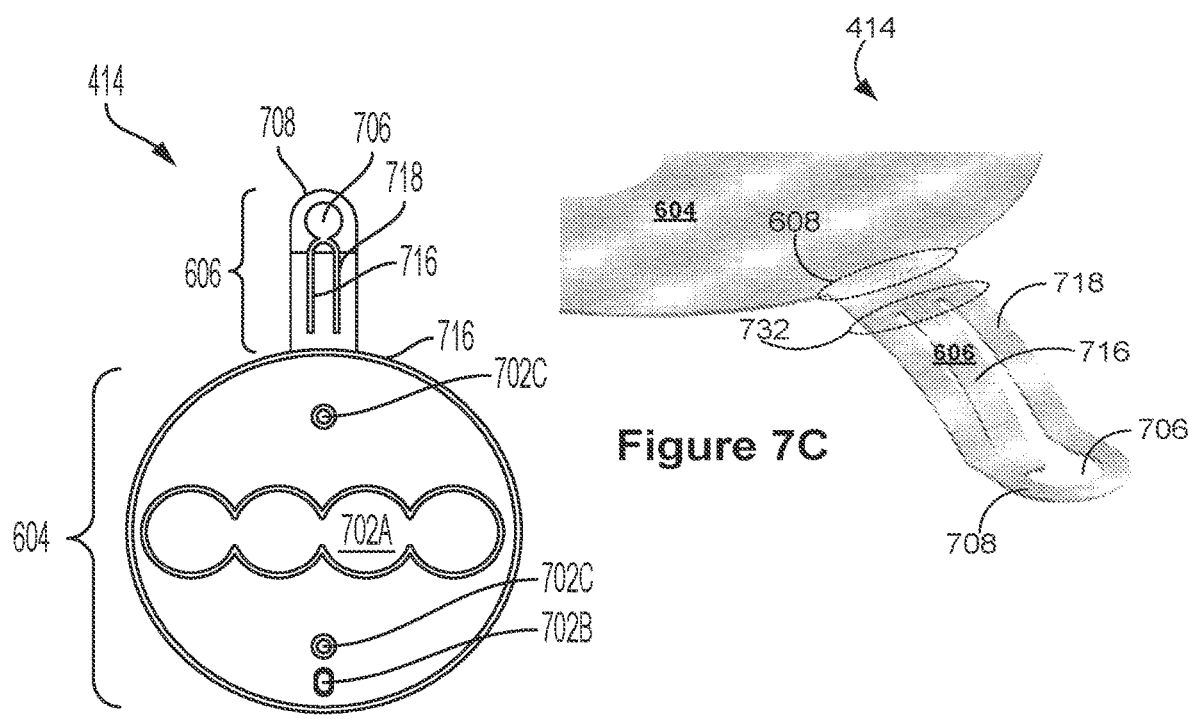
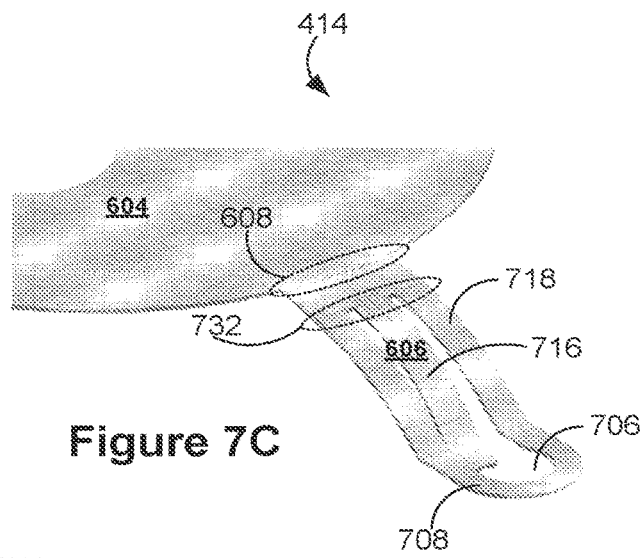
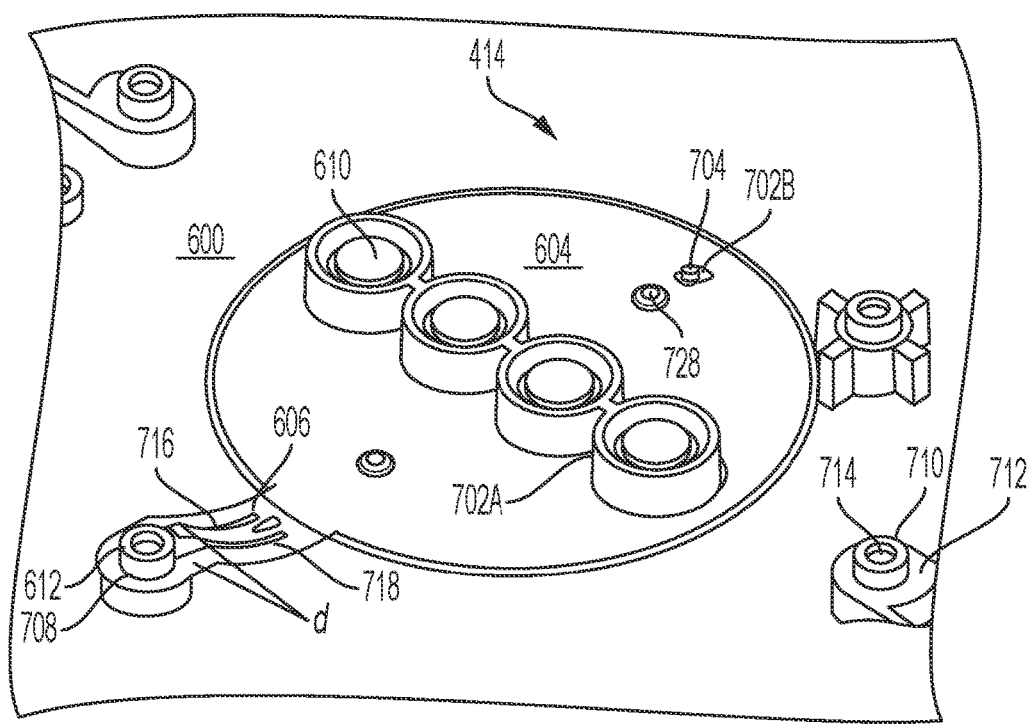
Figure 7A
Figure 7C
Figure 7B

Loose screw

COMPACT HOME ASSISTANT DEVICE

RELATED APPLICATIONS

This application is a continuation of U.S. application Ser. No. 17/362,469, filed Jun. 29, 2021, titled "Compact Home Assistant Having Touch Sensitive Housing," which is a continuation of U.S. application Ser. No. 16/898,252, filed Jun. 10, 2020, titled "Compact Home Assistant Having Touch Sensitive Housing," which claims priority to U.S. Provisional Patent Application No. 62/878,269, filed Jul. 24, 2019, titled "Compact Home Assistant Having Touch Sensitive Housing and Controlled Sound Path," the disclosures of which are incorporated by reference herein.

This application is related to U.S. patent application Ser. No. 16/898,262, filed Jun. 10, 2020, titled "Compact Home Assistant Having a Controlled Sound Path," which is incorporated by reference herein in its entirety.

This application is related to U.S. patent application Ser. No. 16/285,061, filed Feb. 25, 2019, entitled "Compact Speaker Device" and U.S. patent application Ser. No. 15/840,844, filed Dec. 13, 2017, entitled "Design for Compact Home Assistant with Combined Acoustic Waveguide and Heat Sink," which claims priority to U.S. Provisional Patent Application No. 62/441,144, titled "Design for Compact Home Assistant with Combined Acoustic Waveguide and Heat Sink," filed on Dec. 30, 2016. Each of the aforementioned applications is incorporated by reference herein in its entirety.

TECHNICAL FIELD

This application relates generally to computer technology, including but not limited to methods and systems for providing a voice activated electronic device that is used as a user interface in a smart home or media environment and has a touch sensitive housing and/or a controlled sound path accessible to a microphone.

BACKGROUND

Electronic devices integrated with microphones have been widely used to collect voice inputs from users and implement different voice-activated functions according to the voice inputs. In many operating environments it is more desirable and convenient (or even necessary) for a user to receive audible responses to their voice inputs instead of visual information shown on a display. This can be the case when an electronic device that is providing user assistance does not have a display screen (as is the case with the Google Home voice-activated speaker, which is powered by the Google Assistant) or when a user is not able to interact with a display screen (as is the case in many home environments, where a user is interacting with a voice-activated assistant device that is not nearby or where a user is focused on a particular task). For such operating environments, the electronic device is oftentimes provided with a speaker system that generates sound of sufficient clarity and volume to provide effective audible responses to user requests for assistance. Depending on the home/operating environment in which such electronic assistant devices are deployed, the assistant devices can also be designed with different appearances and/or form factors.

Particularly, it is helpful to calibrate available user interfaces of an electronic device to allow them to perform reliably and to provide supplemental user interface functions in addition to the microphones, the speaker system or simple light emitting diode (LED) indicators. These challenges are heightened when it is desired that the electronic device possess a relatively simple and compact form factor and can be made at a low cost. Thus, there is a need for compact designs for electronic voice-assistant devices that has multiple user interface options calibrated for reliable performance.

SUMMARY

Voice-activated electronic devices provide in a small form factor voice assistant capabilities that enable users to perform a range of activities through natural language voice commands, including one or more of: controlling local and remote electronic devices, issuing requests for services and information to remote servers, and/or sending media information to other electronic devices for consumption by the user or other users. In some implementations, voice-activated electronic devices include visual indicators, such as one or more full-color LEDs that are used to indicate the status of voice processing associated with a spoken user request. In some implementations, voice-activated electronic devices include one or more speakers that can be used to relay audible information to a user to provide an answer to a user request (such a search query or a request for a basketball score), provide a spoken status of a voice processing operation, play a musical selection, and/or read digest of current news or the current weather forecast. Given that voice inputs are convenient for users, some implementations allow a user to use voice inputs to control other electronic devices accessible to the user in addition to requesting Internet-based services and functions from remote servers and mobile devices.

Implementations of electronic devices are described herein that provide an eyes-free and hands-free voice interface to enable users to activate voice-activated functions on associated media player devices, issue information requests to remote servers, consume audible information or media, and/or control smart home or smart media devices coupled within the voice-activated electronic devices in a smart media or smart home environment. In various implementations described herein, a smart media environment includes one or more voice-activated electronic devices and multiple media display devices each disposed at a distinct location. In some implementations, these devices are coupled to a cast device (e.g., a set top box, a Google Chromecast™ device or a smart TV). These devices can be directed via voice requests issued to a voice-activated electronic device to play media items identified verbally by a user. These network-connected and voice-activated electronic devices are normally placed on surfaces at different locations of the smart home environment. As such, in some implementations, electronic voice assistant devices are configured to have a form factor and appearance that matches the overall smart home environment and/or can be integrated with multiple compatible surfaces and devices throughout the environment.

It is desirable to provide supplemental user interface functions to a voice-activated electronic device in addition to the microphones, the speaker system or simple LED indicators. Accordingly, in one aspect of the application, an electronic device is provided with one or more touch sensors. Specifically, the electronic device includes a housing, a printed circuit board (PCB) and the one or more touch sensors coupled between the housing and the PCB. The housing has an interior surface, an exterior surface opposing the interior surface, and one or more boss structures coupled on the interior surface. The PCB has a first surface and one or more receiving holes. The first surface faces the interior surface of the housing and includes a conductive area surrounding each receiving hole. Each touch sensor includes a sensing portion and a contact portion extending from the sensing portion. In each touch sensor, the sensing portion is placed in proximity to the interior surface of the housing, and is configured to detect a touch on a corresponding area of the exterior surface of the housing. The contact portion includes an opening aligned with a receiving hole of the PCB and a boss structure of the housing. The contact portion further includes a contact ring in which the opening is defined and a spring finger physically separated from the contact ring. Both the contact ring and the spring finger are configured to electrically contact the conductive area on the PCB. In some implementations, each touch sensor includes a capacitive sensing component.

In some implementations, the sensing portion of each touch sensor is placed in proximity to the interior surface of the housing, when a distance between a surface of the sensing portion and the interior surface of the housing is not greater than a predetermined distance threshold.

In some implementations, for a first touch sensor, the spring finger extends beyond a plane of the contact ring and towards the PCB, and a tip area of the spring finger is configured to be controlled by a stiffness of the spring finger to contact the conductive area of the PCB when the contact ring is electrically coupled to the conductive area of the PCB by a fastener coupled to the boss structure of the housing. Further, in some implementations, the tip area of the spring finger is configured to be controlled by the stiffness of the spring finger to contact the conductive area of the PCB when the fastener is loosened from the boss structure of the housing to cause the contact ring to be electrically decoupled from the conductive area of the PCB.

In some implementations, the sensing portion and contact portion of each touch sensor are made from a single sheet of conductive material and connected to each other at an intersection area. Further, in some implementations, the contact portion further includes an arm that connects the intersection area to the contact ring. The arm merges with the spring finger at the intersection area, and has a first stiffness and a first bending curvature with respect to the sensing portion. The first stiffness is distinct from a second stiffness of the spring finger, and the first bending curvature is distinct from a second bending curvature of the spring finger. Further, in some implementations, the second stiffness and second bending curvature of the spring finger are configured to create a force in a target force range when the contact portion is electrically coupled to the corresponding conductive area on the PCB via the contact ring and a tip area of the spring finger. In some situations, the spring finger is physically modified to result in the second stiffness of the spring finger.

In some implementations, the one or more touch sensors includes a first touch sensor configured to bridge the housing and the PCB, and the contact portion of the first touch sensor is mechanically bent from the sensing portion of the first touch sensor that is placed in proximity to the interior surface of the housing to reach the corresponding conductive area of the PCB.

In some implementations, for each touch sensor, a shank of the corresponding boss structure of the housing is configured to fit in both the opening of the touch sensor and the receiving hole of the PCB and mate to a fastener to couple the touch sensor between the housing and the PCB. Further, in some implementations, the receiving hole of the PCB is configured to have a diameter less than a diameter of a head of the fastener and greater than an outer diameter of the shank of the boss structure of the housing.

In some implementations, one of the receiving holes of the PCB has a first diameter for a first portion of a thickness of the PCB and a second diameter for a second portion of the thickness of the PCB. The first diameter is less than a diameter of a head of a fastener. A diameter of the boss structure of the housing is greater than the first diameter and less than the second diameter of the one of the receiving holes. When the fastener is fastened to the boss structure, the boss structure sits in the one of the receiving holes of the PCB and does not rise out of the one of the receiving holes.

In some implementations, the one or more touch sensors include three touch sensors that are disposed in proximity to a top area and two opposing peripheral (e.g., off-center) area of the housing, respectively.

In some implementations, the one or more touch sensors include a capacitive electrode that forms a capacitive touch sensor with a ground of the electronic device. The PCB includes a capacitive sense circuit that is electrically coupled to the capacitive electrode via the corresponding conductive area of the PCB. The capacitive sense circuit is configured to measure a capacitive sense signal of the capacitive touch sensor and determine a touch on the corresponding area of the exterior surface of the housing based on the measured capacitive sense signal.

In some implementations, the one or more touch sensors include a touch sensing electrode, and the sensing portion of the touch sensing electrode includes a cutout opening aligned with a light emitting diode (LED) mounted on the PCB. A light guide is disposed in the cutout opening, and is configured to receive light emitted by the LED and provide illumination via an LED opening on the housing to indicate a corresponding location on the exterior surface of the housing where the touch sensing electrode is located. Alternatively, in some implementations, the one or more touch sensors includes a touch sensing electrode. A light guide is disposed in proximity to the touch sensing electrode, and is configured to receive light emitted by a LED mounted on the PCB and provide illumination via an LED opening on the housing to indicate a corresponding location on the exterior surface of the housing to which the touch sensing electrode is adjacent.

In some implementations, the one or more touch sensors includes a touch sensing electrode, and the sensing portion of the touch sensing electrode includes a cutout opening aligned with one or more LEDs mounted on the PCB. One or more light guides are disposed in the cutout opening, and are configured to receive light emitted by the LEDs and provide illumination via LED openings on the housing to indicate a status of the electronic device according to a visual specification.

In some implementations, for each touch sensor, one or more of the conductive area on the PCB, the contact ring and a tip area of the spring finger are coated with a conductive material having a resistivity lower than a resistivity threshold to improve contact of the conductive area on the PCB with the contact ring or the tip area of the spring finger.

Further, it is helpful to calibrate available user interfaces of a voice-activated electronic device to allow them to perform reliably. In another aspect of the application, an electronic device is provided with a controlled sound path to a microphone that is concealed within an acoustically porous cover. The electronic device includes a housing having an exterior surface and an aperture, a microphone enclosed in the housing and having a diaphragm, and an acoustically porous cover at least partially covering the exterior surface of the housing. The diaphragm of the microphone faces the aperture and is configured to receive sound via the aperture. The acoustically porous cover conceals the aperture of the housing. The exterior surface of the housing includes a sealing area surrounding but not including the aperture, and the acoustically porous cover is affixed to the sealing area of the exterior surface via an adhesive. The adhesive covers the sealing area of the exterior and permeates a thickness of the acoustically porous cover above the sealing area, thereby enabling formation of the controlled sound path to the microphone by coupling of a microphone testing fixture to a region of the acoustically porous cover corresponding to the sealing area. In some implementations, the sealing area includes a circular ring area.

In some implementations, the aperture of the housing includes a first aperture. The electronic device further includes a PCB that is enclosed in the housing and has a first surface facing an interior surface of the housing, a second surface opposing the first surface, and a second aperture aligned with the first aperture of the housing. The microphone is coupled to the second surface of the PCB, and the diaphragm of the microphone faces the second aperture of the PCB directly and is configured to receive sound via the second aperture of the PCB. A sound control structure is coupled to the interior surface of the housing and the first surface of the PCB, and forms a sound channel connecting the first aperture of the housing and the second aperture of the PCB and extending to the controlled sound path that passes across the acoustically porous cover. Further, in some implementations, the sound control structure includes a hollow cylinder that is concentric with the sealing area on the exterior surface of the housing and the controlled sound path that passes across the acoustically porous cover.

Alternatively, in some implementations, the aperture of the housing includes a first aperture. The electronic device further includes a sound control structure coupled to the interior surface of the housing and the microphone. The sound control structure forms a sound channel connecting the first aperture of the housing and the microphone and extending to the controlled sound path that passes across the acoustically porous cover. Further, in some implementations, a PCB is enclosed in the housing and has a first surface facing an interior surface of the housing. The microphone is mounted on the first surface of the PCB, and the diaphragm of the microphone faces the first aperture of the housing directly.

In some implementations, the acoustically porous cover is flexible and substantially transparent to audible sound.

In some implementations, the controlled sound path in the acoustically porous cover is configured to match a dimension of the microphone testing fixture and guide sound generated by the microphone towards the microphone testing fixture. When the microphone testing fixture is coupled to the controlled sound path, a portion of sound generated by the microphone testing fixture is collected by the microphone. The portion of sound is greater than a predetermined portion of the sound generated by the microphone testing fixture.

In some implementations, the adhesive is not visible from an exterior surface of the acoustically porous cover, so that the electronic device keeps a clean look.

In some implementations, the adhesive is configured to be applied on the sealing area of the housing and covered by the acoustically porous cover, and the adhesive permeates the thickness of the acoustically porous cover and is hardened in response to heat treatment under a predetermined condition.

In some implementations, the adhesive permeates at least a predetermined portion of an entire thickness of the acoustically porous cover, and the microphone testing fixture is configured to be pressed onto the region of the acoustically porous cover to compress microcavities in part of the entire thickness of the acoustically porous cover that is not permeated with the adhesive, thereby enabling formation of the controlled sound path of the microphone.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 7A and 7B illustrate an example touch sensor disposed in proximity to an upper interior surface of a voice-activated electronic device in accordance with some implementations. FIG. 7C is an enlarged view of a contact portion of an example touch sensor in accordance with some implementations.

FIGS. 7D-1 and 7D-2 are example cross sections of a voice-activated electronic device including a touch sensor in accordance with some implementations.

Like reference numerals refer to corresponding parts throughout the several views of the drawings.

DESCRIPTION OF IMPLEMENTATIONS

Figure 1:
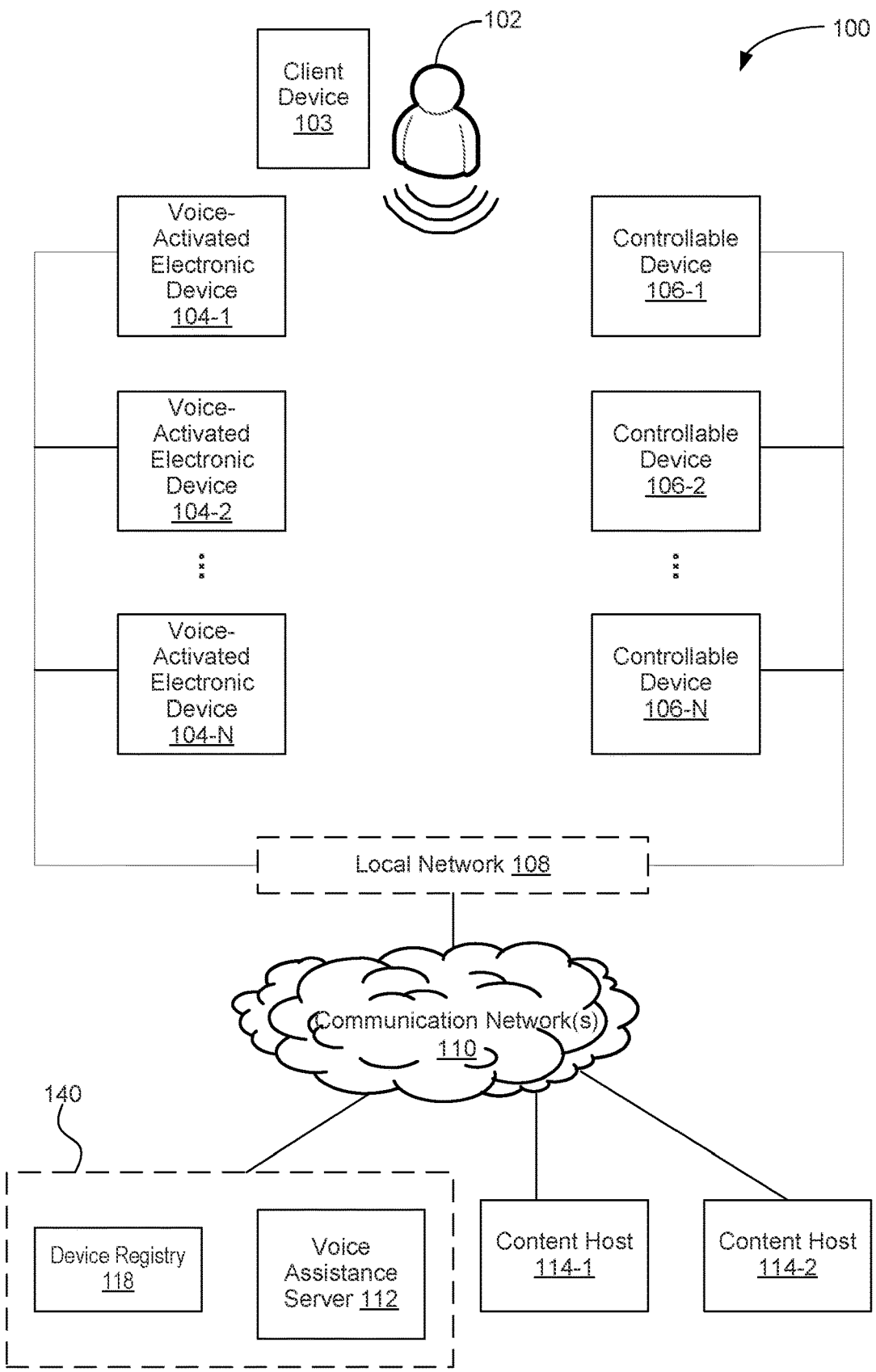
FIG. 1 illustrates an example operating environment of one or more voice-activated electronic devices in accordance with some implementations.

Electronic devices are conveniently used as voice interfaces to receive voice inputs from users and initiate voice-activated functions, and thereby offer eyes-free and hands-free solutions for enabling simple and productive user interaction with both existing and emerging technology. Specifically, the voice inputs received at an electronic device with voice activated features can carry instructions and information even if a user's line of sight is obscured and his or her hands are full. To enable a hands-free and eyes-free experience, a voice-activated electronic device in accordance with the present invention "listens" to the ambient (i.e., constantly processes audio signals collected from the ambient) constantly or only when triggered to do so (e.g., via user utterance of a "hot word" to trigger operation of the electronic device"). On the other hand, user identities are linked with a user's voice and a language used by the user. To protect the user identities, these voice-activated electronic devices are normally used in non-public places that are protected, controlled and intimate spaces (e.g., home and car).

In accordance with various implementations of this application, a network-connected and voice-activated electronic device is a compact device that includes one or more microphones, one or more speakers and a plurality of electronic components, including one or more of: microprocessors, memory, support chips, wireless receivers and transmitters, antennas, power supply circuitry, one or more cameras, power and/or data connectors, etc., some of which are mounted on one or more printed circuit boards. In some implementations, the microphones and corresponding apertures are enclosed in a housing of the electronic device and concealed under an acoustically porous cover of the electronic device. The microphones must be calibrated with a microphone testing fixture to verify audio performances of the microphones (e.g., a sound leakage level at a microphone, an attenuation between an open state and a sealed state of a microphone), thereby guaranteeing that the microphones can reliably detect hot words in a smart home environment. An exterior surface of the housing includes a sealing area surrounding but not including each microphone aperture, and the acoustically porous cover is affixed to the sealing area of the exterior surface via an adhesive. The adhesive covers the sealing area on the exterior surface of the housing and permeates a thickness of the acoustically porous cover above the sealing area, thereby enabling formation of a controlled sound path to the microphone by coupling of the microphone testing fixture to a region of the acoustically porous cover corresponding to the sealing area.

In some implementations, a network-connected and voice-activated electronic device is capable of detecting touch events occurring on its exterior surface (particularly, on one or more selected areas on the exterior surface). The electronic device includes one or more touch sensors disposed inside the housing and in proximity to an interior surface of the housing corresponding to the selected areas of the exterior surface where the touch events are detected. Each touch sensor includes a sensing portion placed in proximity to the interior surface of the housing, and a contact portion extending from the sensing portion to a PCB where a plurality of electronic components (including a touch sensing circuit) are mounted. To enhance its electrical contact with the PCB, the contact portion relies on both a contact ring and a spring finger that are physically separate from each other to form electrical contacts with the PCB. Specifically, the contact portion includes an opening that is defined by the contact ring and is aligned with a receiving hole of the PCB and a boss structure of the housing. While the contact ring is electrically coupled to a conductive area of the PCB surrounding the receiving hole, the spring finger also comes into contact with the conductive area of the PCB under the influence of a mechanical stiffness provided by its own mechanical structure. Under some circumstances, the contact ring of the contact portion is slightly detached from the conductive area, thereby compromising the quality of its electrical contact with the conductive area of the PCB. The mechanical stiffness provided by the mechanical structure of the spring finger can continue to hold the spring finger down onto the contact area of the PCB and provide a low resistance electrical path to access the PCB.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations, Voice Assistant Operating Environment FIG. 1 is an example operating environment 100 in accordance with some implementations. Operating environment 100 includes one or more voice-activated electronic devices 104 (e.g., voice-activated electronic devices 104-1 thru 104-N, hereinafter "voice-activated device(s)"). The one or more voice-activated devices 104 may be located in one or more locations (e.g., all in a room or space of a structure, spread out throughout multiple spaces within a structure or throughout multiple structures (e.g., one in a house and one in the user's car)).

The environment 100 also includes one or more controllable electronic devices 106 (e.g., electronic device 106-1 thru 106-N, hereinafter "controllable device(s)"). Examples of controllable devices 106 include media devices (smart televisions, speaker systems, wireless speakers, set-top boxes, media streaming devices, cast devices), and smart home devices (e.g., smart camera, smart thermostat, smart light, smart hazard detector, smart door lock).

The voice-activated devices 104 and the controllable devices 106 are communicatively coupled, through communication networks 110, to a voice assistant service 140 (e.g., to a voice assistance server system 112 of the voice assistant service 140). In some implementations, one or more of the voice-activated devices 104 and the controllable devices 106 are communicatively coupled to a local network 108, which is communicatively coupled to the communication networks 110; the voice-activated device(s) 104 and/or the controllable device(s) 106 are communicatively coupled to communication network(s) 110 (and, through the communication networks 110, to the voice assistance server system 112) via the local network 108. In some implementations, the local network 108 is a local area network implemented at a network interface (e.g., a router). The voice-activated devices 104 and the controllable devices 106 that are communicatively coupled to the local network 108 may also communicate with each other through the local network 108.

Optionally, one or more of the voice-activated devices 104 are communicatively coupled to the communication networks 110 and are not on the local network 108. For example, these voice-activated devices are not on the Wi-Fi network corresponding to the local network 108 but are connected to the communication networks 110 through a cellular connection. In some implementations, communication between voice-activated devices 104 that are on the local network 108 and voice-activated devices 104 that are not on the local network 108 are done through the voice assistance server system 112. The voice-activated devices 104 (whether on the local network 108 or on the network 110) are registered in a device registry 118 of the voice assistant service 140 and thus known to the voice assistance server system 112. Similarly, the voice-activated devices 104 that are not on the local network 108 may communicate with controllable devices 106 through the voice assistant server system 112. The controllable devices 106 (whether on the local network 108 or on the network 110) are also registered in the device registry 118. In some implementations, communications between the voice-activated devices 104 and the controllable devices 106 go through the voice assistance server system 112.

In some implementations, the environment 100 also includes one or more content hosts 114. A content host 114 may be a remote content source from which content is streamed or otherwise obtained in accordance with a request included in a user voice input or command. A content host 114 may be an information source from which the voice assistance server system 112 retrieves information in accordance with a user voice request.

In some implementations, controllable devices 106 are capable of receiving commands or requests to perform specified operations or to transition to specified states (e.g., from a voice-activated device 104 and/or the voice assistance server system 112) and to perform the operations or transition states in accordance with the received commands or requests.

In some implementations, one or more of the controllable devices 106 are media devices that are disposed in the operating environment 100 to provide to one or more users media content, news and/or other information. In some implementations, the content provided by the media devices is stored at a local content source, streamed from a remote content source (e.g., content host(s) 114), or generated locally (e.g., through a local text to voice processor that reads a customized news briefing, emails, texts, a local weather report, etc. to one or more occupants of the operating environment 100). In some implementations, the media devices include media output devices that directly output the media content to an audience (e.g., one or more users), and cast devices that are networked to stream media content to the media output devices. Examples of the media output devices include, but are not limited to television (TV) display devices and music players. Examples of the cast devices include, but are not limited to, set-top boxes (STBs), DVD players, TV boxes, and media streaming devices, such as Google's Chromecast™ media streaming device.

In some implementations, a controllable device 106 is also a voice-activated device 104. In some implementations, a voice-activated device 104 is also a controllable device 106. For example, a controllable device 106 may include a voice interface to the voice assistance service 140 (e.g., a media device that can also receive, process, and respond to user voice inputs). As another example, a voice-activated device 104 may also perform particular operations and transition to particular states in accordance with requests or commands in voice inputs (e.g., a voice interface device that can also play streaming music).

In some implementations, the voice-activated devices 104 and the controllable deices 106 are associated with a user having a respective account, or with multiple users (e.g., a group of related users, such as users in a family or in an organization; more generally, a primary user and one or more authorized additional users) having respective user accounts, in a user domain. A user may make voice inputs or voice commands to the voice-activated device 104. The voice-activated device 104 receives these voice inputs from the user (e.g., user 102), and the voice-activated device 104 and/or the voice assistance server system 112 proceeds to determine a request in the voice input and generate a response to the request.

In some implementations, the request included in a voice input is a command or request to a controllable device 106 to perform an operation (e.g., play media, pause media, fast forward or rewind media, change volume, change screen brightness, change light brightness) or transition to another state (e.g., change the mode of operation, turn on or off, go into sleep mode or wake from sleep mode).

In some implementations, a voice-activated electronic device 104 responds to voice inputs by: generating and providing a spoken response to a voice command (e.g., speaking the current time in response to the question, "what time is it?"); streaming media content requested by a user (e.g., "play a Beach Boys song"); reading a news story or a daily news briefing prepared for the user; playing a media item stored on the personal assistant device or on the local network; changing a state or operating one or more other connected devices within the operating environment 100 (e.g., turning lights, appliances or media devices on/off, locking/unlocking a lock, opening windows, etc.); or issuing a corresponding request to a server via a network 110.

In some implementations, the one or more voice-activated devices 104 are disposed in the operating environment 100 to collect audio inputs for initiating various functions (e.g., media play functions of the media devices). In some implementations, these voice-activated devices 104 (e.g., devices 104-1 thru 104-N) are disposed in proximity to a controllable device 104 (e.g., a media device), for example, in the same room with the cast devices and the media output devices. Alternatively, in some implementations, a voice-activated device 104 is disposed in a structure having one or more smart home devices but not any media device. Alternatively, in some implementations, a voice-activated device 104 is disposed in a structure having one or more smart home devices and one or more media devices. Alternatively, in some implementations, a voice-activated device 104 is disposed in a location having no networked electronic device. Further, in some implementations, a room or space in the structure may have multiple voice-activated devices 104.

In some implementations, the voice-activated device 104 includes at least one or more microphones, a speaker, a processor and memory storing at least one program for execution by the processor. The speaker is configured to allow the voice-activated device 104 to deliver voice messages and other audio (e.g., audible tones) to a location where the voice-activated device 104 is located in the operating environment 100, thereby broadcasting music, reporting a state of audio input processing, having a conversation with or giving instructions to a user of the voice-activated device 104. As an alternative to the voice messages, visual signals could also be used to provide feedback to the user of the voice-activated device 104 concerning the state of audio input processing. When the voice-activated device 104 is a mobile device (e.g., a mobile phone or a tablet computer), its display screen is configured to display a notification concerning the state of audio input processing.

In some implementations, the voice-activated device 104 is a voice interface device that is network-connected to provide voice recognition functions with the aid of a voice assistance server system 112. For example, the voice-activated device 104 includes a smart speaker that provides music to a user and allows eyes-free and hands-free access to a voice assistant service (e.g., Google Assistant). Optionally, the voice-activated device 104 is one of a desktop or laptop computer, a tablet, a mobile phone that includes a microphone, a cast device that includes a microphone and optionally a speaker, an audio system (e.g., a stereo system, a speaker system, a portable speaker) that includes a microphone and a speaker, a television that includes a microphone and a speaker, and a user interface system in an automobile that includes a microphone and a speaker and optionally a display. Optionally, the voice-activated device 104 is a simple and low cost voice interface device. Generally, the voice-activated device 104 may be any device that is capable of network connection and that includes a microphone, a speaker, and programs, modules, and data for interacting with voice assistant service. Given simplicity and low cost of the voice-activated device 104, the voice-activated device 104 includes an array of light emitting diodes (LEDs) rather than a full display screen, and displays a visual pattern on the LEDs to indicate the state of audio input processing. In some implementations, the LEDs are full color LEDs, and the colors of the LEDs may be employed as a part of the visual pattern to be displayed on the LEDs. Multiple examples of using LEDs to display visual patterns in order to convey information or device status are described in U.S. Provisional Patent Application No. 62/336,566, entitled "LED Design Language for Visual Affordance of Voice User Interfaces," filed May 13, 2016, which is incorporated by reference in its entirety. In some implementations, visual patterns indicating the state of voice processing operations are displayed using characteristic images shown on conventional displays associated with voice-activated devices that are performing the voice processing operations.

In some implementations, LEDs or other visual displays are used to convey a collective voice processing state of multiple participating electronic devices. For example, in an operating environment where there are multiple voice processing or voice interface devices (e.g., multiple electronic devices 400 as shown in FIG. 4A of the '566 application; multiple voice-activated devices 104), groups of color LEDs (e.g., LEDs 404 as shown in FIG. 4A of the '566 application) associated with respective electronic devices can be used to convey which of the electronic devices is listening to a user, and which of the listening devices is the leader (where the "leader" device generally takes the lead in responding to a spoken request issued by the user).

More generally, the '566 application describes (e.g., see paras. [0087]-[0100]) a "LED Design Language" for indicating visually using a collection of LEDs a variety of voice processing states of an electronic device, such as a "Hot word detection state and listening state," a "Thinking mode or working mode," and a "Responding mode or speaking mode." In some implementations, unique states of voice processing operations described herein are represented using a group of LEDs in accordance with one or more aspects of the "LED Design Language" of the '566 application. These visual indicators can also be combined with one or more audible indicators generated by electronic devices that are performing voice processing operations. The resulting audio and/or visual indicators will enable users in a voice-interactive environment to understand the state of various voice processing electronic devices in the environment and to effectively interact with those devices in a natural, intuitive manner.

In some implementations, when voice inputs to the voice-activated device 104 are used to control the media output devices via the cast devices, the voice-activated device 104 effectively enables a new level of control of cast-enabled media devices. In a specific example, the voice-activated device 104 includes a casual enjoyment speaker with far-field voice access and functions as a voice interface device for the voice assistant service. The voice-activated device 104 could be disposed in any area in the operating environment 100. When multiple voice-activated devices 104 are distributed in multiple rooms, they become cast audio receivers that are synchronized to provide voice inputs from these rooms.

Specifically, in some implementations, the voice-activated device 104 includes a Wi-Fi speaker with a microphone that is connected to a voice-activated voice assistant service (e.g., Google Assistant). A user can issue a media play request via the microphone of voice-activated device 104, and ask the voice assistant service to play media content on the voice-activated device 104 itself or on another connected media output device. For example, the user can issue a media play request by saying to the Wi-Fi speaker "OK Google, play cat videos on my Living room TV." The voice assistant service then fulfils the media play request by playing the requested media content on the requested device using a default or designated media application.

In some implementations, a user can issue a voice request, via the microphone of the voice-activated device 104, concerning media content that has already been played or is being played on a display device (e.g., the user can ask for information about the media content, buy the media content through an online store, or compose and issue a social post about the media content).

In some implementations, a user may want to take a current media session with them as they move through the house and can request such a service from one or more of the voice-activated devices 104. This requires the voice assistant service 140 to transfer the current media session from a first cast device to a second cast device that is not directly connected to the first cast device or has no knowledge of the existence of the first cast device. Subsequent to the media content transfer, a second output device coupled to the second cast device continues to play the media content previously a first output device coupled to the first cast device from the exact point within a music track or a video clip where play of the media content was forgone on the first output device. In some implementations, the voice-activated device 104 that receives the request to transfer the media session can satisfy the request. In some implementations, the voice-activated device 104 that receives the request to transfer the media session relays the request to another device or system (e.g., voice assistance server system 112) for handling.

Further, in some implementations, a user may issue, via the microphone of voice-activated device 104, a request for information or for performance of an action or operation. The information requested may be personal (e.g., the user's emails, the user's calendar events, the user's flight information, etc.), non-personal (e.g., sports scores, news stories, etc.) or somewhere in between (e.g., scores for teams or sports preferred by the user, news stories from the user's preferred sources, etc.). The requested information or action/operation may involve access to personal information (e.g., purchasing a digital media item with payment information provided by the user, purchasing a physical good). The voice-activated device 104 responds to the request with voice message responses to the user, where the response may include, for example, requests for additional information to fulfill the request, confirmation that the request has been fulfilled, notice that the request cannot be fulfilled, and so forth.

In some implementations, in addition to the voice-activated devices 104 and the media devices amongst the controllable devices 106, the operating environment 100 may also include one or more smart home devices amongst the controllable devices 106. The integrated smart home devices include intelligent, multi-sensing, network-connected devices that integrate seamlessly with each other in a smart home network and/or with a central server or a cloud-computing system to provide a variety of useful smart home functions. In some implementations, a smart home device is disposed at the same location of the operating environment 100 as a cast device and/or an output device, and therefore, is located in proximity to or with a known distance with respect to the cast device and the output device.

The smart home devices in the operating environment 100 may include, but are not limited to, one or more intelligent, multi-sensing, network-connected thermostats, one or more intelligent, network-connected, multi-sensing hazard detectors, one or more intelligent, multi-sensing, network-connected entryway interface devices and (hereinafter referred to as "smart doorbells" and "smart door locks"), one or more intelligent, multi-sensing, network-connected alarm systems, one or more intelligent, multi-sensing, network-connected camera systems, one or more intelligent, multi-sensing, network-connected wall switches, one or more intelligent, multi-sensing, network-connected power sockets, and one or more intelligent, multi-sensing, network-connected lights. In some implementations, the smart home devices in the operating environment 100 of FIG. 1 includes a plurality of intelligent, multi-sensing, network-connected appliances (hereinafter referred to as "smart appliances"), such as refrigerators, stoves, ovens, televisions, washers, dryers, lights, stereos, intercom systems, garage-door openers, floor fans, ceiling fans, wall air conditioners, pool heaters, irrigation systems, security systems, space heaters, window AC units, motorized duct vents, and so forth. In some implementations, any one of these smart home device types can be outfitted with microphones and one or more voice processing capabilities as described herein so as to in whole or in part respond to voice requests from an occupant or user.

In some implementations, each of the controllable devices 104 and the voice-activated devices 104 is capable of data communications and information sharing with other controllable devices 106, voice-activated electronic devices 104, a central server or cloud-computing system, and/or other devices (e.g., a client device) that are network-connected. Data communications may be carried out using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

Through the communication networks 110 (e.g., the Internet), the controllable devices 106 and the voice-activated devices 104 may communicate with a server system (also called a central server system and/or a cloud-computing system herein). Optionally, the server system may be associated with a manufacturer, support entity, or service provider associated with the controllable devices and the media content displayed to the user. Accordingly, the server system includes the voice assistance server 112 that processes audio inputs collected by voice-activated devices 104, one or more content hosts 114 that provide the displayed media content, optionally a cloud cast service server creating a virtual user domain based on distributed device terminals, and the device registry 118 that keeps a record of the distributed device terminals in the virtual user environment. Examples of the distributed device terminals include, but are not limited to the controllable devices 106, the voice-activated devices 104, and the media output devices. In some implementations, these distributed device terminals are linked to a user account (e.g., a Google user account) in the virtual user domain. It should be appreciated that processing of audio inputs collected by voice-activated devices 104 can be performed locally at a voice-activated device 104, at a voice assistance server 112, at another smart home device (e.g., a hub device) or at some combination of all or subset of the above.

It will be appreciated that in some implementations the voice-activated device(s) 104 also function in an environment without smart home devices. For example, a voice-activated device 104 can, even in the absence of smart home devices, respond to user requests for information or performance of an action, and/or to initiate or control various media play functions. A voice-activated device 104 can also function in a wide range of environments, including, without limitation, a vehicle, a ship, a business, or a manufacturing environment.

In some implementations, a voice-activated device 104 is "awakened" (e.g., to activate an interface for the voice assistant service on the voice-activated device 104, to put the voice-activated device 104 into a state where the voice-activated device 104 is ready to receive voice requests to the voice assistant service) by a voice input that includes a hotword (also called a "wake word"). In some implementations, the voice-activated device 104 requires awakening if the voice-activated device 104 has been idle with respect to receipt of voice inputs for at least a predefined amount of time (e.g., 5 minutes); the predefined amount of time corresponds to an amount of idle time allowed before a voice interface session or conversation times out. The hotword may be a word or phrase, and may be a predefined default and/or may be customized by a user (e.g., a user may set a nickname for a particular voice-activated device 104 as the device's hotword). In some implementations, there may be multiple hotwords that can awaken a voice-activated device 104. A user may speak the hotword, wait for an acknowledgement response from the voice-activated device 104 (e.g., the voice-activated device 104 outputs a greeting), and them make a first voice request. Alternatively, the user may combine the hotword and the first voice request in one voice input (e.g., the voice input includes the hotword followed by the voice request).

In some implementations, a voice-activated device 104 interacts with a controllable device 106 (e.g., a media device, a smart home device), a client device or a server system of an operating environment 100 in accordance with some implementations. The voice-activated device 104 is configured to receive audio inputs from an environment in proximity to the voice-activated device 104. Optionally, the voice-activated device 104 stores the audio inputs and at least partially processes the audio inputs locally. Optionally, the voice-activated device 104 transmits the received audio inputs or the partially processed audio inputs to a voice assistance server system 112 via the communication networks 110 for further processing. The voice-activated device 104 or the voice assistance server system 112 determines if there is a request in the audio input and what the request is, determines and generates a response to the request, and transmits the request to one or more controllable device(s) 106. The controllable device(s) 106 receiving the response is configured to perform operations or change states in accordance with the response. For example, a media device is configured to obtain media content or Internet content from one or more content hosts 114 for display on an output device coupled to the media device, in accordance with a response to the request in the audio input.

In some implementations, the controllable device(s) 106 and the voice-activated device(s) 104 are linked to each other in a user domain, and more specifically, associated with each other via a user account in the user domain. Information on the controllable device 106 (whether on the local network 108 or on the network 110) and the voice-activated device 104 (whether on the local network 108 or on the network 110) are stored in the device registry 118 in association with the user account. In some implementations, there is a device registry for controllable devices 106 and a device registry for voice-activated devices 104. The controllable devices registry may reference devices in the voice-activated devices registry that are associated in the user domain, and vice versa.

In some implementations, one or more of the voice-activated devices 104 (and one or more cast devices) and one or more of the controllable devices 106 are commissioned to the voice assistant service 140 via a client device 103. In some implementations, the voice-activated device 104 does not include any display screen, and relies on the client device 103 to provide a user interface during a commissioning process, and similarly for a controllable device 106 as well. Specifically, the client device 103 is installed with an application that enables a user interface to facilitate commissioning of a new voice-activated device 104 and/or a controllable device 106 disposed in proximity to the client device. A user may send a request on the user interface of the client device 103 to initiate a commissioning process for the new electronic device 104/106 that needs to be commissioned. After receiving the commissioning request, the client device 103 establishes a short range communication link with the new electronic device 104/103 that needs to be commissioned. Optionally, the short range communication link is established based near field communication (NFC), Bluetooth, Bluetooth Low Energy (BLE) and the like. The client device 103 then conveys wireless configuration data associated with a wireless local area network (WLAN) (e.g., local network 108) to the new or electronic device 104/106. The wireless configuration data includes at least a WLAN security code (i.e., service set identifier (SSID) password), and optionally includes a SSID, an Internet protocol (IP) address, proxy configuration and gateway configuration. After receiving the wireless configuration data via the short range communication link, the new electronic device 104/106 decodes and recovers the wireless configuration data, and joins the WLAN based on the wireless configuration data.

In some implementations, additional user domain information is entered on the user interface displayed on the client device 103, and used to link the new electronic device 104/106 to an account in a user domain. Optionally, the additional user domain information is conveyed to the new electronic device 104/106 in conjunction with the wireless communication data via the short range communication link. Optionally, the additional user domain information is conveyed to the new electronic device 104/106 via the WLAN after the new device has joined the WLAN.

Once the electronic device 104/106 has been commissioned into the user domain, other devices and their associated activities may be controlled via multiple control paths. In accordance with one control path, an application installed on the client device 103 is used to control the other device and its associated activities (e.g., media play activities). Alternatively, in accordance with another control path, the electronic device 104/106 is used to enable eyes-free and hands-free control of the other device and its associated activities.

In some implementations, voice-activated devices 104 and controllable devices 106 may be assigned nicknames by a user (e.g., by the primary user with whom the devices are associated in the user domain). For example, a speaker device in the living room may be assigned a nickname "living room speaker." In this way, the user may more easily refer to a device in a voice input by speaking the device's nickname. In some implementations, the device nicknames and mappings to corresponding devices are stored at a voice-activated device 104 (which would store the nicknames of just the devices associated with the same user as the voice-activated device) and/or the voice assistance server system 112 (which would store deice nicknames of devices associated with different users). For example, the voice assistance server system 112 stores many device nicknames and mappings across different devices and users, and voice-activated devices 104 associated with a particular user download nicknames and mappings for devices associated with the particular user for local storage.

In some implementations, a user may group one or more of the voice-activated devices 104 and/or controllable devices 106 into a group of devices created by the user. The group may be given a name, and the group of devices may be referred by the group name, similarly to referring to individual devices by nickname. Similarly to device nicknames, device groups and group names may be stored at a voice-activated device 104 and/or the voice assistance server system 112.

A voice input from the user may explicitly specify a target controllable device 106 or a target group of devices for the request in the voice input. For example, a user may utter a voice input "play classical music on the living room speaker." The target device in the voice input is "living room speaker"; the request in the voice input is a request to have the "living room speaker" play classical music. As another example, a user may utter a voice input "play classical music on the house speakers," where "house speakers" is a name of a group of devices. The target device group in the voice input is "house speakers"; the request in the voice input is a request to have the devices in the group "house speakers" play classical music.

A voice input from the user may not have an explicit specification of a target device or device group; a reference to a target device or device group by name is absent in the voice input. For example, following on the example voice input "play classical music on the living room speaker" above, the user may utter a subsequent voice input "pause." The voice input does not include a target device specification for the request for a pause operation. In some implementations, the target device specification in the voice input may be ambiguous. For example, the user may have uttered the device name incompletely. In some implementations, a target device or device group may be assigned to the voice input where an explicit target device specification is absent or the target device specification is ambiguous, as described below.

In some implementations, when a voice-activated device 104 receives a voice input with an explicit specification of a target device or device group, the voice-activated device 104 establishes a focus session with respect to the specified target device or device group. In some implementations, the voice-activated device 104 stores, for the focus session, a session start time (e.g., the timestamp of the voice input based on which the focus session was started) and, as the in-focus device for the focus session, the specified target device or device group. In some implementations, the voice-activated device 104 also logs subsequent voice inputs in the focus session. The voice-activated device 104 logs at least the most recent voice input in the focus session and optionally logs and retains preceding voice inputs within the focus session as well. In some implementations, the voice assistance server system 112 establishes the focus session. In some implementations, the focus session may be ended by a voice input explicitly specifying a different target device or device group.

While a focus session with respect to a device is active and the voice-activated device receives a voice input, the voice-activated device 104 makes one or more determinations with respect to the voice input. In some implementations, the determinations include: whether the voice inputs includes an explicit target device specification, whether the request in the voice input is one that can be fulfilled by the in-focus device, and a time of the voice input compared to the time of the last voice input in the focus session and/or the session start time. If the voice input does not include an explicit target device specification, includes a request that can be fulfilled by the in-focus device, and satisfies predefined time criteria with respect to the time of the last voice input in the focus session and/or the session start time, then the in-focus device is assigned as the target device for the voice input. Further details regarding focus sessions are described below.

Devices in the Operating Environment

Figure 2:
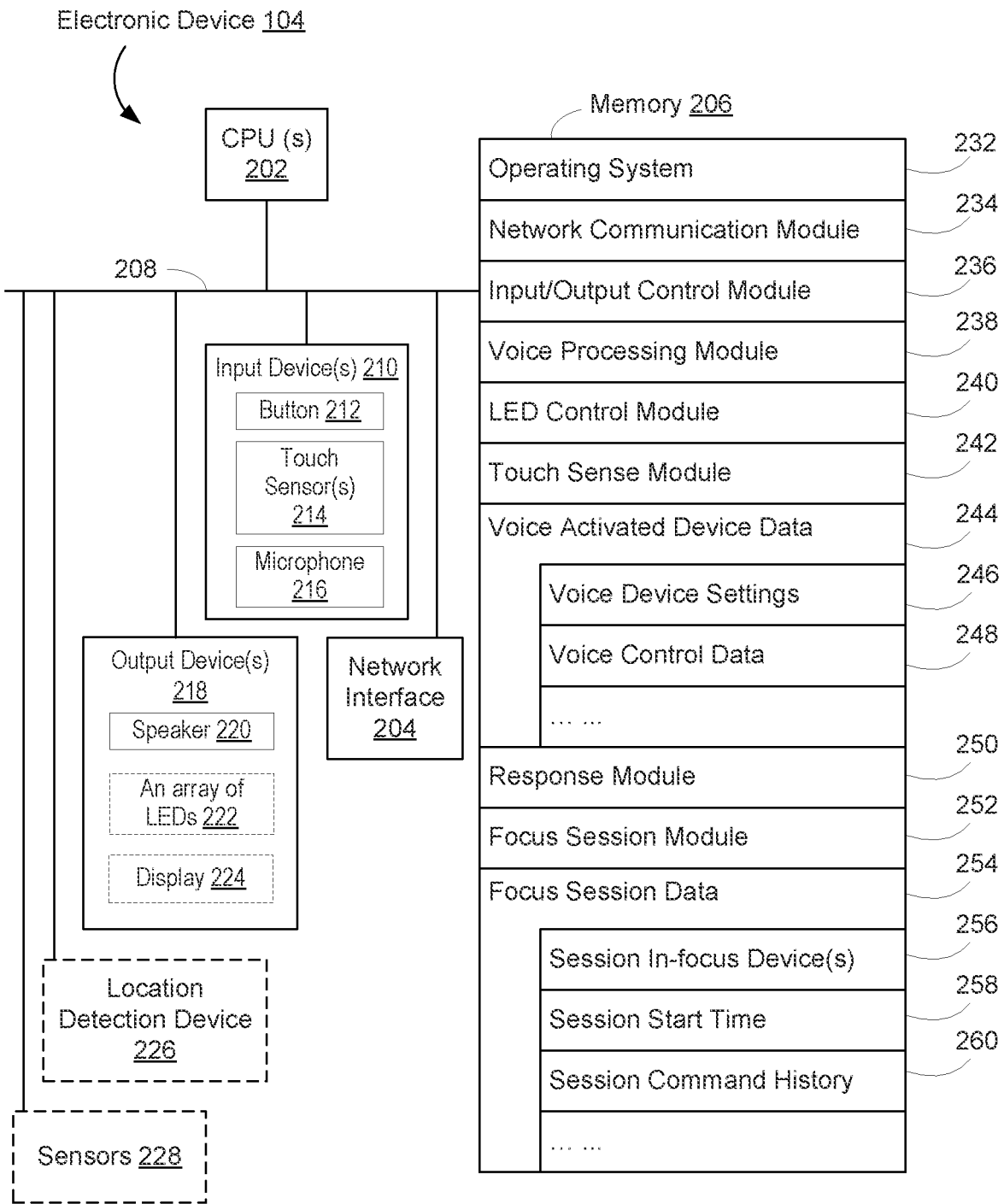
FIG. 2 is a block diagram illustrating an example voice-activated electronic device that is applied as a voice interface to collect user voice commands in an operating environment in accordance with some implementations.

FIG. 2 is a block diagram illustrating an example voice-activated electronic device 104 that is applied as a voice interface to collect user voice commands in an operating environment (e.g., operating environment 100) in accordance with some implementations. The voice-activated device 104, typically, includes one or more processing units (CPUs) 202, one or more network interfaces 204, memory 206, and one or more communication buses 208 for interconnecting these components (sometimes called a chipset). The voice-activated device 104 includes one or more input devices 210 that facilitate user input, such as a button 212, one or more touch sensors 214, and one or more microphones 216. The voice-activated device 104 also includes one or more output devices 218, including one or more speakers 220, optionally an array of LEDs 222, and optionally a display 224. In some implementations, the array of LEDs 222 is an array of full color LEDs. In some implementations, a voice-activated device 104, depending on the type of device, has either the array of LEDs 222, or the display 224, or both. In some implementations, the voice-activated device 104 also includes a location detection device 226 (e.g., a GPS module) and one or more sensors 228 (e.g., accelerometer, gyroscope, light sensor, etc.).

In some implementations, the one or more touch sensors 214 includes a plurality of sensor electrodes that are disposed in proximity to different areas of an interior surface of a housing of the voice-activated electronic device 104. Each of the different areas of the interior surface corresponds to a respective area of an exterior surface of the housing of the housing of the voice-activated electronic device 104. Each sensor electrode corresponding to a respective area of the interior surface is configured to provide an electrical signal that varies in response to a touch event occurring to the respective area of the exterior surface of the housing. In an example, a first sensor electrode is disposed under a top area of the interior surface of the housing, and two additional sensor electrodes are disposed under two off-center areas that are located on two opposite sides of the top area of the interior surface of the housing. Each sensor electrode forms a capacitive sensor with reference to a ground of the electronic device 104, and enables a capacitive sensing signal that varies in response to the touch event on the respective area of the exterior surface of the housing.

Memory 206 includes high-speed random access memory, such as DRAM, SRAM, DDR RAM, or other random access solid state memory devices; and, optionally, includes non-volatile memory, such as one or more magnetic disk storage devices, one or more optical disk storage devices, one or more flash memory devices, or one or more other non-volatile solid state storage devices. Memory 206, optionally, includes one or more storage devices remotely located from one or more processing units 202. Memory 206, or alternatively the non-volatile memory within memory 206, includes a non-transitory computer readable storage medium. In some implementations, memory 206, or the non-transitory computer readable storage medium of memory 206, stores the following programs, modules, and data structures, or a subset or superset thereof:

Operating system 232 including procedures for handling various basic system services and for performing hardware dependent tasks;

Network communication module 234 for connecting the voice-activated device 104 to other devices (e.g., the voice assistance service 140, one or more controllable devices 106, one or more client devices 103, and other voice-activated device(s) 104) via one or more network interfaces 204 (wired or wireless) and one or more networks 110, such as the Internet, other wide area networks, local area networks (e.g., local network 108), metropolitan area networks, and so on;

Input/output control module 236 for receiving inputs via one or more input devices and enabling presentation of information at the voice-activated device 104 via one or more output devices 218, including:

Voice processing module 238 for processing audio inputs or voice messages collected in an environment surrounding the voice-activated device 104, or preparing the collected audio inputs or voice messages for processing at a voice assistance server system 112;

LED control module 240 for generating visual patterns on the LEDs 222 according to device states of the voice-activated device 104; and Touch sense module 242 for sensing touch events on a top surface (e.g., via the one or more touch sensors 214) of the voice-activated device 104;

Voice activated device data 244 for storing at least data associated with the voice-activated device 104, including:

Voice device settings 246 for storing information associated with the voice-activated device 104 itself, including common device settings (e.g., service tier, device model, storage capacity, processing capabilities, communication capabilities, etc.), information of one or more user accounts in a user domain, device nicknames and device groups, settings regarding restrictions when dealing with a nonregistered user, and display specifications associated with one or more visual patterns displayed by the LEDs 222; and Voice control data 248 for storing audio signals, voice messages, response messages and other data related to voice interface functions of the voice-activated device 104;

Response module 250 for performing instructions included in voice request responses generated by the voice assistance server system 112, and in some implementations, generating responses to certain voice inputs; and Focus session module 252 for establishing, managing, and ending focus sessions with respect to devices.

In some implementations, the voice processing module 238 includes the following modules (not shown):

User identification module for identifying and disambiguating users who provide voice inputs to the voice-activated device 104;

Hotword recognition module for determining whether voice inputs include a hotword for waking up the voice-activated device 104 and recognizing such in the voice inputs; and Request recognition module for determining a user request included in a voice input.

In some implementations, memory 206 also stores focus session data 254 for an outstanding focus session, including the following:

Session in-focus device(s) 256 for storing an identifier of the device or device group in focus in an outstanding focus session (e.g., the device nickname, the device group name, MAC address(es) of the device(s));

Session start time 258 for storing a timestamp for the start of the outstanding focus session; and Session command history 260 for storing a log of prior requests or commands in the focus session, including at least the most recent request/command. The log includes at least the timestamp(s) of the logged prior request(s)/command(s).

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various implementations. In some implementations, memory 206, optionally, stores a subset of the modules and data structures identified above. Furthermore, memory 206, optionally, stores additional modules and data structures not described above. In some implementations, a subset of the programs, modules, and/or data stored in the memory 206 can be stored on and/or executed by the voice assistance server system 112.

In some implementations, one or more of the modules in memory 206 described above are part of a voice processing library of modules. The voice processing library may be implemented and embedded on a wide variety of devices. An example of a voice processing library is described in U.S. Provisional Patent Application No. 62/334,434, entitled "Implementations for Voice Assistant on Devices," filed May 10, 2016, which is incorporated by reference herein in its entirety.

It is noted that in some implementations, the one or more touch sensors 214 are electrically coupled to a touch sensing circuit that are physically disposed on and supported by a PCB on which the CPUs 202 are mounted. Each of the one or more touch sensors 214 includes a sensing portion and a contact portion extending from the sensing portion. While the sensing portion is placed in proximity to the interior surface of the housing to facilitate detection of a touch on a corresponding area of the exterior surface of the housing, the contact portion of each touch sensor is bent to bridge the sensing portion to a conductive area on the PCB, thereby providing an electrical path to electrically couple the sensing portion to the touch sensing circuit disposed on the PCB.

Physical Design for a Compact Home Assistant

Figure 3A:
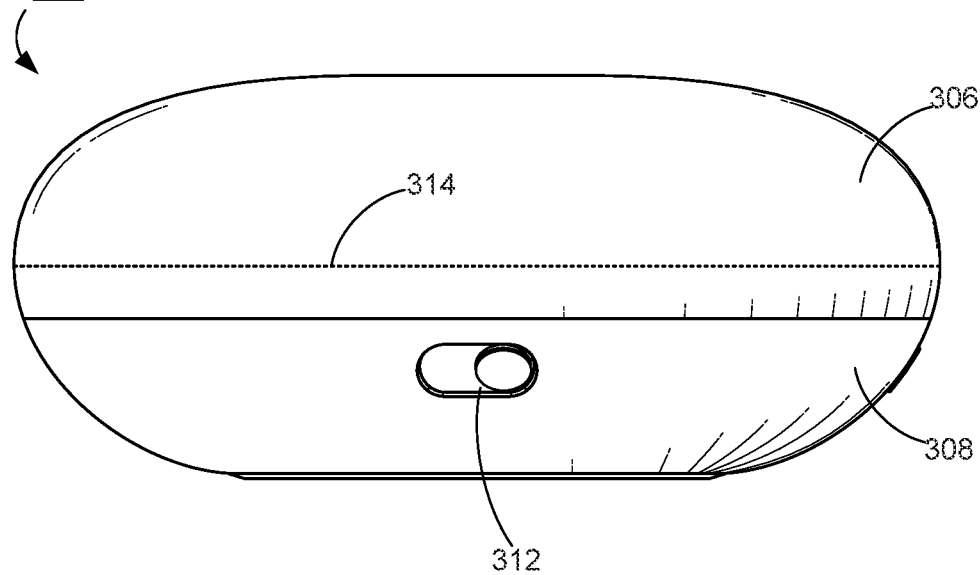
FIGS. 3A and 3B are a front view and a rear view of an example voice-activated electronic device in accordance with some implementations, respectively.
Figure 3B:
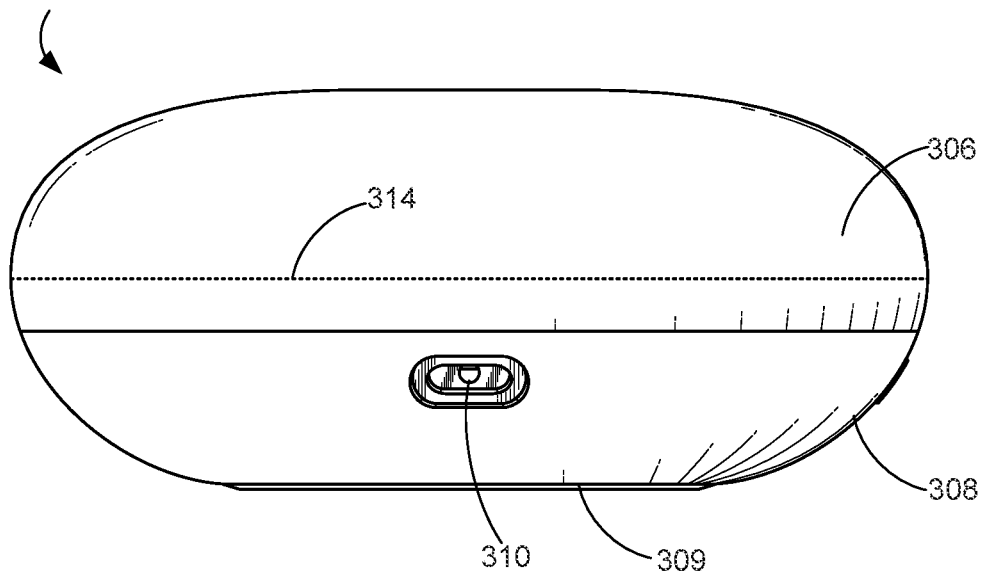

FIGS. 3A and 3B are a front view and a rear view of an example voice-activated electronic device 104 in accordance with some implementations, respectively. The electronic device 104 includes an overall exterior (also called a housing) including an upper portion 306 and a base portion 308 coupled to the upper portion 306. Optionally, the overall exterior of the electronic device 104 is radially symmetric about an axis that passes through centers of the upper and base portions 306 and 308. In some implementations, at least a portion of the base portion 308 (e.g., a bottom surface 309) is flattened to enable the electronic device 104 to sit securely on a flat surface. The electronic device 104 is compact and fits naturally in many areas of a home.

The electronic device 104 further includes electronic components and one or more speakers contained within the overall exterior. For example, the electronic device 104 includes one or more microphones 216 and optionally includes an array of full color LEDs (not shown). The full color LEDs (e.g., LEDs 222 in FIG. 2) could be hidden under a top surface of the electronic device 104 and invisible to the user when they are not lit. The rear side of the electronic device 104 optionally includes a power supply connector 310 configured to couple to a power supply, and the front side optionally includes a power switch 312. That said, the base portion 308 has an opening that enables access to the power supply connector 310, and the opening is optionally positioned adjacent to intersection between the upper portion 306 and the base portion 308.

In some implementations, the electronic device 104 presents a clean look having no visible button or a limited number of visible buttons, and the interaction with the electronic device 104 is based on voice and touch gestures. In some implementations, when the electronic device 104 includes a limited number of physical buttons, the interaction with the electronic device 104 is further based on a press on the button in addition to the voice and touch gestures. Optionally, one of the physical buttons includes a power button that is disposed close to intersection between the first and second elements and configured to switch on or off the electronic device 104.

In some implementations, a transition between the upper portion 306 and the base portion 308 is substantially continuous, such that the overall exterior has a continuously rounded shape. The upper portion 306 of the electronic device 104 has a circular cross section 314 defined by a first radius. The upper portion 306 includes and extends past the circular cross section 314, and the base portion 308 has a second maximum radius that is smaller than the first radius. Optionally, a diameter of the circular cross section of the electronic device 104 is greater than a thickness of the electronic device 104. In some implementations, the circular cross section 314 is approximately a middle cross section of the electronic device 104 that divides the overall exterior of the electronic device 104 into two halves having substantially equal thicknesses. The first radius corresponding to the middle cross section is optionally greater than a radius of any cross section of the electronic device 104.

One or more speakers (not shown) are disposed and concealed in the electronic device 104 and project sound through a porous wall of the overall exterior to allow sound waves generated from the speaker to penetrate to the outside of the electronic device 104. In some implementations, the upper portion 306 has a first exterior surface covering (e.g., the acoustically porous cover in FIG. 4), and the base portion 308 has a second exterior surface covering different from the first exterior surface covering. The first exterior surface covering is substantially acoustically transparent to allow sound generated by the speakers to exit the electronic device 104. In an example, at least a portion of the upper portion 306 includes perforations (e.g., 410 in FIGS. 4 and 5) configured to enable transmission of sound out of the electronic device 104. The perforations of the upper portion 306 is covered by the first exterior surface covering, and the base portion 308 does not include any perforations to allow sound to transmit out of the electronic device 104.

Figure 4:
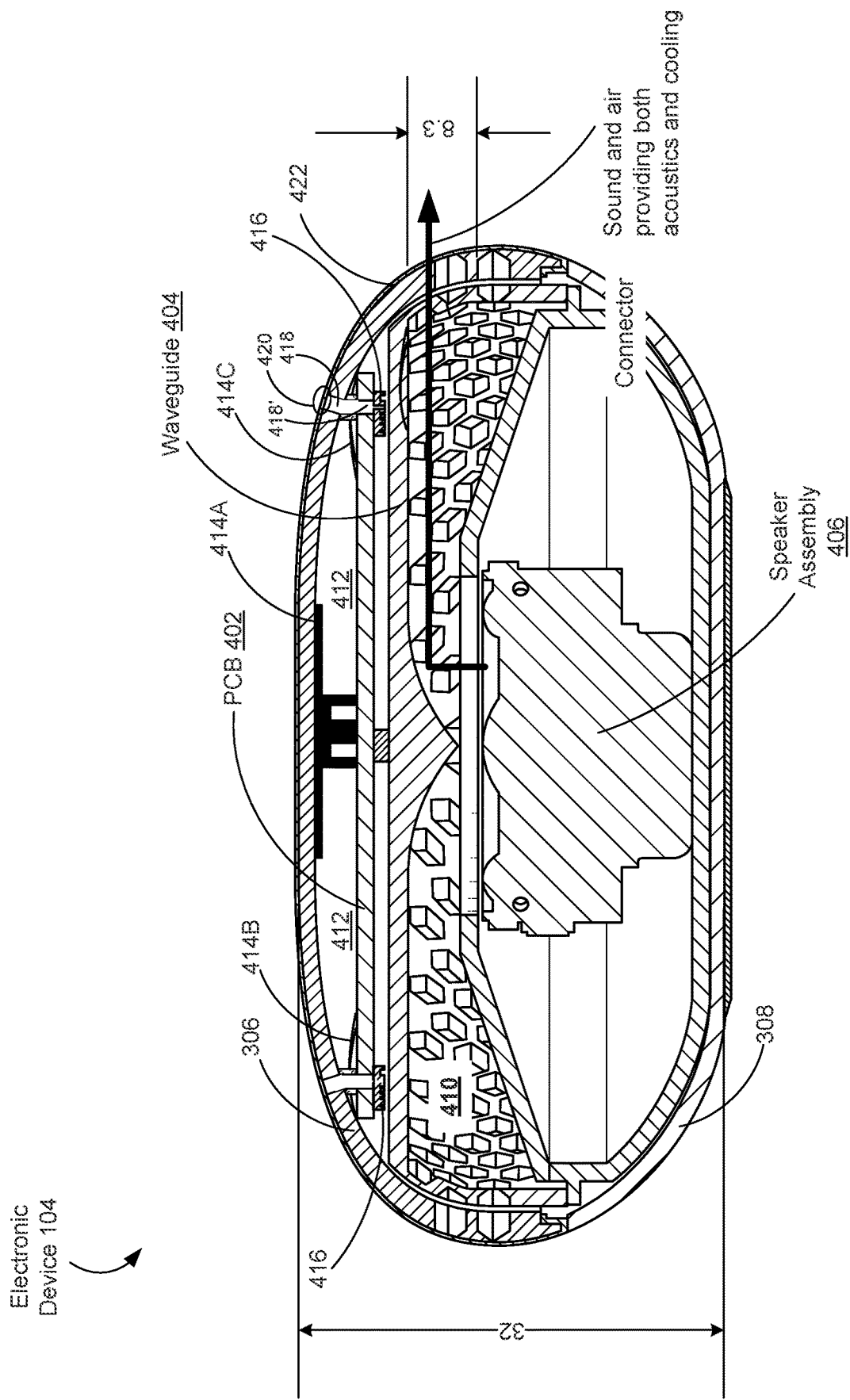
FIG. 4 is a cross sectional view of an example voice-activated electronic device showing a dual purpose waveguide/heatsink and a speaker assembly in accordance with some implementations.

FIG. 4 is a cross sectional view of an example voice-activated electronic device 104 showing a dual purpose waveguide/heatsink 404 (also called a waveguide 404) and a speaker assembly 406 in accordance with some implementations. In some implementations, the electronic device 104 is a compact device that includes one or more speakers 406 and a plurality of electronic components, including one or more of: microprocessors, memory, support chips, wireless receivers and transmitters, antennas, power supply circuitry, one or more cameras, power and/or data connectors, touch sensing circuit, etc., some of which are mounted on one or more printed circuit boards 402. The speakers ("speaker assembly") 406 can be employed for any audio output purpose, including output of audible responses to user verbal inputs, playback of audio tracks of media content, and generation of audible alerts (including beeps, alarms, sirens, etc.). In some implementations, the one or more speakers 406 are mounted within the electronic device 104 such that there is no direct path for transmission to the outside of the device of sound generated by the one or more speakers 406. In such implementations, in order to promote effective speaker operation (including effective transmission of sound output by the speaker 406 to the outside of the device), an acoustic waveguide 404 is provided within the electronic device 104 to redirect sound output by the one or more speakers 406 from the inside to the outside of the device.

In some implementations, the electronic device includes an upper portion 306 that serves as a speaker grill that allows transmission of sound outside the device from one or more speakers 406 contained within the electronic device 104. In some implementations, the upper portion/speaker grill 306 can be configured with different surface finishes and/or can be securely but separably fastened to the base portion 308 as described in provisional patent application 62/403,681, entitled "Voice-Activated Electronic Device Assembly with Separable Base," the contents of which are incorporated herein by reference in their entirety. In some implementations, the acoustic waveguide 404 is configured to redirect the sound to a speaker grill provided at an outer surface of the overall exterior of the electronic device 104.

In some implementations, the acoustic waveguide 404 is also configured to serve as a heatsink to dissipate to the outside of the electronic device heat generated by operation of the electronic components and is mounted in proximity to at least some of the electronic components (e.g., components mounted on the PCB 402, or the PCB 402).

In some implementations, the one more speakers 406 are mounted in a base portion 308 (e.g., "bottom housing") of the electronic device 104 and have a primary sound projection direction that faces upwards within the electronic device 104, towards a curved portion of the dual purpose waveguide/heatsink 404. The curved portion is designed to redirect sound from the one or more speakers 406 to the outside of the electronic device 104 (e.g., via perforations 410 on the upper portion 306). Heat generating electronic components and/or one or more printed circuit boards 402 carrying electronic components are attached directly to a second portion of the dual purpose waveguide/heatsink 404 (or are coupled indirectly thereto using a thermal conduction path) so as to transmit to the heatsink heat generated by operation of the electronic components. The dual purpose waveguide/heatsink 404 is configured to move to the outside of the electronic device heat transmitted thereto from the attached electronic components. In some implementations, the dual purpose waveguide/heatsink 404 is made from materials that have highly effective thermal conduction properties to promote movement of heat from within the device to the outside of the device. In some implementations, the curved portion is a bottom surface of the dual purpose waveguide/heatsink 404 (e.g., a surface facing downwards towards the one or more speakers 406) and the second portion is an upper surface of the dual purpose waveguide/heatsink 404 that is opposite the bottom surface of the dual purpose waveguide/heatsink 404 (e.g., a surface facing upwards to which the electronic components are attached). Other shapes and forms of the upper and lower portions of the waveguide/heatsink 404 can be employed as would be apparent to one skilled in the art.

In some implementations, positions of the electronic components and the one more speakers 406 are interchanged such that the one more speakers 406 are located in an upper portion 306 of the electronic device 104 and project downwards towards an upper (curved) surface of the dual purpose waveguide/heatsink 404 and the electronic components are mounted in a base portion 308 of the electronic device 104 and waveguide/heatsink 404 is mounted in the base portion 308 (e.g., "bottom housing").

In some implementations, the acoustic waveguide design channels sound from speaker 406 to desired output ports and thermally attached to the PCB 402 allowing the waveguide 404 to also function as heatsink/spreader. Wrapping the waveguide/heatsink 404 on the interior of the housing allows for larger thermal mass and greater surface for thermal radiation. In some implementations, a cutout pattern on a wrapped portion of the waveguide enhances thermal efficiency and allows sound to transmit out. In some implementations, during speaker function, sound waves also drives air over waveguide/heat sink 404 thus further enhancing thermal performance at time of greatest thermal generation.

In some implementations, the cone of the waveguide/heat sink redirects the sound from the up pointing speaker 406 to the side. Since the PCB 402 is directly on top of the dual purpose waveguide/heatsink 404, it is also used as a heat sink. The dual purpose waveguide/heatsink 404 should be a highly thermally conductive material. In some implementations, a waveguide material of the dual purpose waveguide/heatsink 404 is a metal, (e.g., aluminum or copper), but the waveguide/heat sink 404 can also be fashioned from materials other than metal.

The PCB 402 is arranged and concealed within the electronic device 104, and at least electrically coupled to the speaker assembly 406. That said, the PCB 402 includes one or more electronic components configured to drive the speaker assembly 406, a power supply circuitry, and a wireless transceiver configured to receive and transmit signals. Referring to FIGS. 3A and 3B, in some implementations, the base portion 308 includes a power supply connector 310 configured to couple to an external power supply and the front side optionally includes a power switch 312, and the PCB is configured to receive power from the external power supply via the power supply connect 310.

Figure 5:
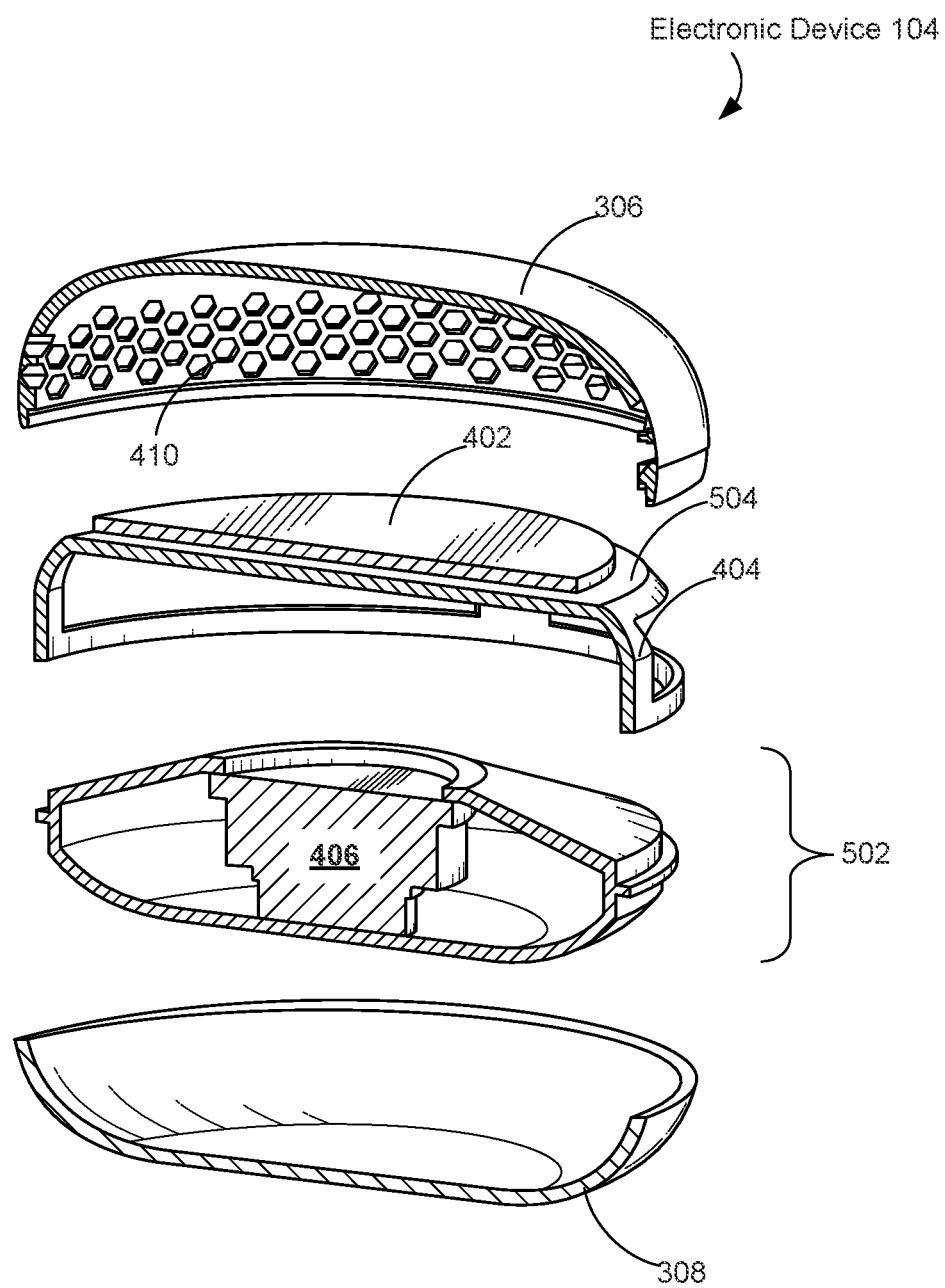
FIG. 5 is an exploded view of an example voice-activated electronic device in accordance with some implementations.

FIG. 5 is an exploded view of an example voice-activated electronic device 104 in accordance with some implementations. This shows a perforated upper portion 306, the dual purpose waveguide/heatsink 404, an assembly 502 combining a bottom portion of the waveguide 404 and the speaker assembly 406, and the base portion 308. The upper portion 306 includes perforations 410 on a peripheral wall to allow transmission of sound waves generated by the speaker assembly 406 to exit the electronic device 104. Specifically, the dual purpose waveguide/heatsink 404 is provided within the electronic device 104 to redirect sound output by the one or more speakers 406 towards the perforations 410 located on the peripheral wall of the upper portion 306.

The dual purpose waveguide/heatsink 404 has a top surface 504, and a PCB 402 is disposed on the top surface 504 of the waveguide 404. Referring to FIG. 4, the waveguide 404 has a waveguide periphery physically configured to fit into the rounded shape of the upper portion 306. When the waveguide 404 physically fits into the upper portion 306, a space 412 is formed between an upper interior surface of the upper portion 306 and a top surface of the PCB 402. The space 412 is configured to accommodate electronic components mounted onto the PCB 402. In some implementation, one or more touch sensors 414 are coupled in proximity to the upper interior surface of the upper portion 306 to detect touch events occurring to an upper exterior surface opposite the upper interior surface. Each of the touch sensors 414 is configured to extend across the space 412 to reach a respective conductive area of the PCB 402 that is electrically coupled to a touch sensing circuit mounted onto the PCB 402. In some implementations, the electronic device 104 includes a first sensor electrode and two additional sensor electrodes. The first sensor electrode 414A is disposed under a top area of the interior surface of the upper portion 306, and the two additional sensor electrodes 414B and 414C are disposed under two peripheral areas that are located on two opposite sides of the top area of the interior surface of the upper portion 306. Each of the sensor electrodes 414A-414C forms a respective capacitive sensor with reference to a ground of the electronic device 104, and enables the touch sensing circuit (specifically, a capacitive sense circuit) coupled onto the PCB 402 to monitor a capacitive sensing signal that varies in response to the touch events on a respective area of the exterior surface of the upper portion 306. More details on the touch sensors 414 are explained below with reference to FIGS. 6, 7A-7G and 8A-8C.

Referring to FIG. 4, in some implementations, the electronic device 104 further includes one or more microphones 416, and is configured to provide a controlled sound path 420 to access each of the one or more microphones 416 via a respective microphone aperture 418 opened on the upper portion 306. Optionally, a microphone 416 is disposed on top of the PCB 402 (i.e., within the space 412), and coupled to the microphone aperture 418 by a sound control structure. Optionally, a microphone 416 is disposed beneath the PCB 402, and faces a second microphone aperture 418' formed on the PCB 402. The second microphone aperture 418' is further coupled to the microphone aperture 418 by a sound control structure. By these means, the controlled sound path 420 can be formed to connect each microphone 416 to the corresponding microphone aperture 418. In some implementations, an acoustically porous cover 422 is further used to wrap the upper portion 306 and conceal the microphone aperture 418 thereon, and an adhesive is applied with the acoustically porous cover 422 to extend the controlled sound path 420 further across the acoustically porous cover 422. More details on the controlled sound path 420 are explained below with reference to FIGS. 9A-9B and 10A-10C.

Dual Conductive Paths Coupling a Touch Sensor to a Circuit Board

Figure 6:
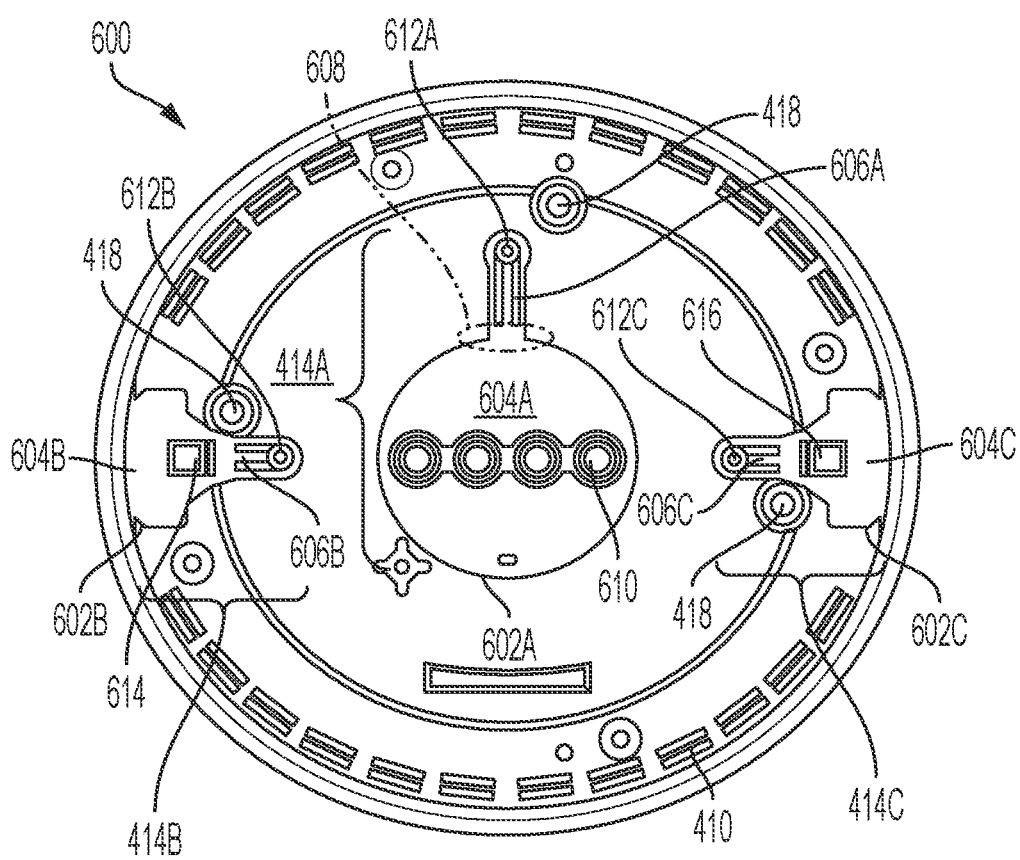
FIG. 6 illustrates an upper interior surface of an example voice-activated electronic device in accordance with some implementations.

FIG. 6 illustrates an upper interior surface 600 of an upper portion 306 of an example voice-activated electronic device 104 in accordance with some implementations. The upper interior surface 600 includes one or more sensor areas where one or more touch sensors 414 are coupled. In some implementations, the one or more sensor areas include a top sensor area 602A where a first touch sensor 414A is coupled. In an example, the top sensor area 602A has a circular shape and is concentric with a cross section of the upper portion 306. In some implementations, the one or more sensor areas further includes one or more peripheral sensor areas (e.g., 602B and 602C) where one or more additional touch sensors 414B and/or 414C are coupled. In this example, two additional sensor electrodes 414B and 414C are disposed under two peripheral sensor areas 602B and 602C that are located on two opposite sides of the top sensor area 602A of the upper interior surface 600 of the upper portion 306. The top sensor 414A and the two additional sensors 414B and 414C are optionally aligned with each other.

The first touch sensor 414A coupled to the first sensor area 602A includes a sensing portion 604A and a contact portion 606A extending from the sensing portion 604A. The sensing portion 604A is substantially planar. In some situations, when it is disposed in proximity to the top sensor area 602, the sensing portion 604A comes into contact with the top sensor area 602. Alternatively, in some situations, when it is disposed in proximity to the top sensor area 602, the sensing portion 604A does not contact the top sensor area 602 directly, and a gap between the sensing portion 605 and the top sensor area 602 is less than a predetermined distance threshold (e.g., 1 mm). In some implementations, the sensing portion 604 and contact portion 606A of the first touch sensor 414A are made from a single sheet of conductive material (e.g., stainless steel) and connected to each other at an intersection area 608. The contact portion 606A is not planar and is bent with a first average curvature. The first average curvature of the contact portion 606A is greater than a second average curvature of the upper portion 306 near the top sensor area 602, thereby allowing the contact portion 606A to deflect away from the upper portion 306. In some implementations, both the sensing and contact portions are planar, but are folded to form an angle at the intersection 608.

In some implementations, the top sensor area 602A is physically coupled to an array of light guides 610 configured to guide light generated by LED indicators towards the upper interior surface 600 of the upper portion 306. Optionally, the upper interior surface 600 includes one or more openings to allow the light guided to the upper interior surface 600 to be visible to the outside. Optionally, at least part of the upper interior surface 600 is partially transparent to the light guided to the upper interior surface 600. The light guides 610 rise above the top sensor area 602 by a height when they are affixed onto the top sensor area 602. The sensing portion 604A of the first touch sensor 414A has one or more cutout openings. When the first touch sensor 414A is disposed in proximity to the first sensor area 602A, the one or more cutout openings of the sensing portion 604A is aligned with and surround the light guides 610, thereby allowing the first touch sensor 414 to be automatically aligned with the first sensor area 602A.

Additionally, the upper interior surface 600 further includes a first boss structure 612A disposed outside the first sensor area 602A. When the first touch sensor 414A is automatically aligned with the first sensor area 602A by the light guides 610, the contact portion 606A extends towards the first boss structure 612A, i.e., the contact portion 606A is automatically aligned with the first boss structure 612A. Specifically, the contact portion 606A includes an opening near its tip area, and the opening of the contact portion 606A is automatically aligned with and is configured to receive the first boss structure 612A when the sensing portion 604 is disposed in proximity to the first sensor area 602A. The contact portion 606A further includes a contact ring defining its opening and a spring finger physically separated from the contact ring. Both the contact ring and the spring finger extends to the first boss structure 612A or an area substantially close to the first boss structure 612A (e.g., less than 5 mm from the first boss structure 612A).

Each additional touch sensor 414B coupled to a peripheral sensor area 602B includes a sensing portion 604B and a contact portion 606B extending from the sensing portion 604. The sensing portion 604B has a shape conformal to a shape of the upper interior surface 600 locally at the peripheral sensor area 602B. When it is disposed in proximity to the peripheral sensor area 602B, the sensing portion 604B optionally comes into contact with or has a substantially small gap with the top sensor area 602B. The gap between the sensing portion 605 and the top sensor area 602 is substantially small, i.e., less than the predetermined distance threshold (e.g., 1 mm). In some implementations, the sensing portion 604B and contact portion 606B of the second touch sensor 414A are made from a single sheet of conductive material. The contact portion 606B is further bent with an average curvature greater than an average curvature of the upper portion 306 near the peripheral sensor area 602B, thereby allowing the contact portion 606B to deflect away from the interior surface of the upper portion 306.

In some implementations, the peripheral sensor area 602B is physically coupled to a second light guide 614 configured to guide light generated by an LED indicator towards the upper interior surface 600 of the upper portion 306. Optionally, the upper interior surface 600 includes one or more openings or is partially transparent to allow the light guided to the upper interior surface 600 to be visible to the outside. The second light guide 614 is affixed onto and rises from the peripheral sensor area 602B. The sensing portion 604B of the additional touch sensor 414B has a cutout opening configured to align with and surround the second light guide 614, thereby allowing the additional touch sensor 414B to be automatically aligned with the peripheral sensor area 602B. In some implementations, a first visual pattern enabled by the one or more light guides 610 indicates a voice processing status of the electronic device 104. A second visual pattern enabled by the second light guide 614 indicates a location of the corresponding touch sensor 414B, and is configured to guide a user of the electronic device 104 to touch on a correct location for the purposes of activating one or more predetermined functions (e.g., increasing a volume, decrease a volume). A third visual pattern enabled by a third light guide 616 indicates a location of the corresponding touch sensor 414C, and has a similar function as that of the second visual pattern. Optionally, the second and third visual patterns correspond to two predetermined functions (e.g., increasing and decreasing a volume) that are opposite to each other.

Additionally, the upper interior surface 600 further includes a second boss structure 612B disposed outside the peripheral sensor area 602B. When the additional touch sensor 414B is automatically aligned with the peripheral sensor area 602B by the second light guide 614, the contact portion 606B extends towards the second boss structure 612B, i.e., the contact portion 606B is automatically aligned with the second boss structure 612B.

In some implementations, the upper interior surface 600 of the upper portion 306 further includes a plurality of microphone apertures 418 configured to let sound enter the housing of the electronic device 104 and guide sound towards one or more microphones 416 disposed inside the housing. Further, in some implementations, the upper interior surface 600 includes one or more speaker grills (i.e., perforations 410) formed on a peripheral wall to allow transmission of sound waves generated by a speaker assembly of the electronic device 104 to exit the housing of the electronic device 104. In the example shown in FIG. 6, the electronic device 104 has two speaker grills separated by the two additional touch sensors 414B and 414C.

FIGS. 7A and 7B illustrate an example touch sensor 414 configured to be disposed in proximity to an upper interior surface 600 of a voice-activated electronic device 104 in accordance with some implementations. FIG. 7C is an enlarged view of a contact portion 606 of an example touch sensor 414 in accordance with some implementations. The touch sensor 414 includes a sensing portion 604 and a contact portion 606 extending from the sensing portion 604. In this example, the sensing portion 604 is substantially planar, and is configured to be disposed in proximity to a substantially flat sensor area 602 (e.g., the top sensor area 602A) of an upper interior surface 600 of a housing. When it is disposed in proximity to the substantially flat sensor area 602, the sensing portion 604 comes into contact with the substantially flat sensor area 602 or is separated by a substantially small gap from the substantially flat sensor area 602. By these means, the sensing portion is configured to detect a touch on a corresponding area of an upper exterior surface 600 of the housing corresponding to the substantially flat sensor area 602 of the housing.

The sensing portion 604 of the first touch sensor 414 has one or more cutout openings 702. In some implementations, a first one 702A of the one or more cutout openings 702 receives an array of light guides 610 that rises above the upper interior surface 600, when the touch sensor 414 is disposed in proximity to the upper interior surface 600. A size of the first one of the one or more cutout openings 702 matches a size of the light guide array 610, such that when the array 610 fits in the opening 702A, the sensing portion 604 can be automatically aligned with a boss structure 612 fixed on the upper interior surface 600. The first one of the one or more cutout openings 702 optionally has a shape that is consistent with or distinct from a shape of the light guide array 610. In some implementations, the one or more cutout openings 702 includes a second opening 702B configured to align with an alignment pin 704 fixed on a corresponding sensor area 602 of the upper interior surface 600. When the touch sensor 414 is assembled onto the electronic device 104, the alignment pin 704 is aligned with and rises out of the second opening 702B. In some implementations, the one or more cutout openings 702 includes one or more third openings 702C configured to facilitate coupling the touch sensor 414 onto the upper interior surface 600 of the upper portion 306 (e.g., affixing the touch sensor 414 onto the upper interior surface 600). For example, a heat stake 728 is applied onto each third opening 702C to hold the touch sensor 414 onto the upper interior surface 600.

The contact portion 606 extends from an edge of the sensing portion 604, and has an opening 706 located near its tip area and a contact ring 708 in which the opening 706 is defined. When the touch sensor 414 is so disposed to allow the light guide array 610 or the alignment pipe 704 to rise out of a corresponding opening 702, the opening 706 of the contact portion 606 is automatically aligned with the boss structure 612 fixed on the upper interior surface 600, and the boss structure 612 at least partially rises out of the opening 706 of the contact portion 606. In an example, the boss structure 612 has a central shank 710 that is partially recessed around its periphery to form a flat recessed periphery 712. The central shank 710 further includes a screw hole 714. When the touch sensor 414 is coupled onto the upper interior surface 600, the central shank 710 of the boss structure 612 rises out of the opening 706 of the contact portion 606, and the contact ring 708 of the contact portion 606 sits on the flat recessed periphery 712 of the boss structure 612.

In addition to the contact ring 708 and the opening 706, the contact portion 606 further includes a spring finger 716 physically separated from the contact ring 708, while both the contact ring 708 and the spring finger 716 are configured to reach the flat recessed periphery 712 of the boss structure 612 or nearby. In some implementations, the contact portion 606 connects to the sensing portion 604 at an intersection area 608. The contact portion 606 further includes an arm 718 that connects the intersection area 608 to the contact ring 708. The arm 718 merges with the spring finger 716 at the intersection area 608 or on the contact portion 606 (e.g., away from the intersection area 608). The arm 718 has a first stiffness and a first bending curvature with respect to the sensing portion 604. The first stiffness is distinct from a second stiffness of the spring finger 716, and the first bending curvature is distinct from a second bending curvature of the spring finger 716. That said, if the first bending curvature of the arm 718 represents the first average curvature of the contact portion 606, the spring finger 716 is bent out of a curved plane of the contact portion 606 (e.g., resulting in a deviation of d at its tip area in FIG. 7B) and deviated further away from a plane of the sensing portion 604 compared with the arm 718. In some implementations, the spring finger 716 is physically modified to result in the second stiffness or the second bending curvature of the spring finger 716. For example, the spring finger 716 may be bent with an angle at its intersection 732 with the arm 718. Alternatively, a thickness of the spring finger 716 may be adjusted at its intersection 732 with the arm 718, e.g., by placing one or more beads on a rear end of the spring finger 716 near its intersection 732 with the arm 718. It is noted that the intersection 732 optionally overlaps or is located away from the intersection area 608.

It is noted that in some implementations, the contact ring 708 and a tip area of the spring finger 716 are bent or flattened with respect to bodies of the arm 718 and the spring finger 716 according to a shape of the flat recessed periphery 712 of the boss structure 612, thereby configuring the contact ring 708 and the tip area of the spring finger 716 to come into close contact with the flat recessed periphery 712. In a natural state shown in FIG. 7B, the contact ring 708 comes into contact with the flat recessed periphery 712 of the boss structure 612, and the spring finger 716 deflects from the arm 718 of the contact portion 606 and does not contact the flat recessed periphery 712. Further, in some implementations, the shank 710 of the boss structure 612 has a rounded shape, and the opening 706 of the contact portion is optionally circular or square, or has another shape in which the shank 710 of the boss structure 612 can fit.

Figures 1, 7D:
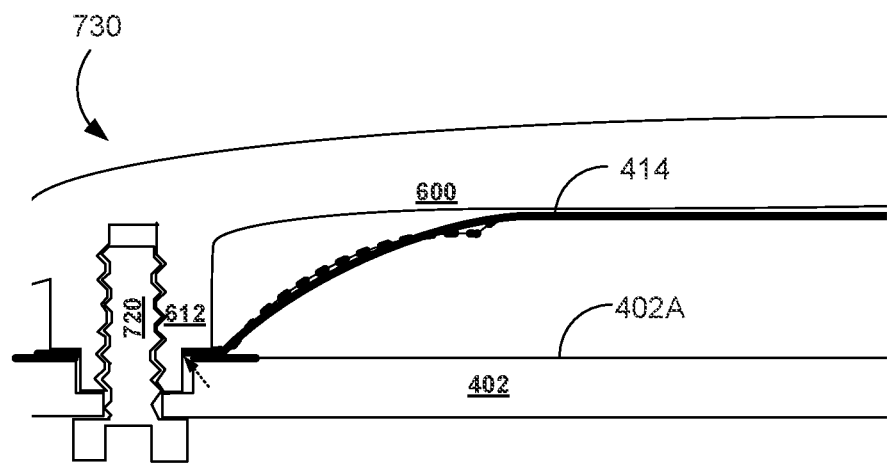
Figures 2, 7D:
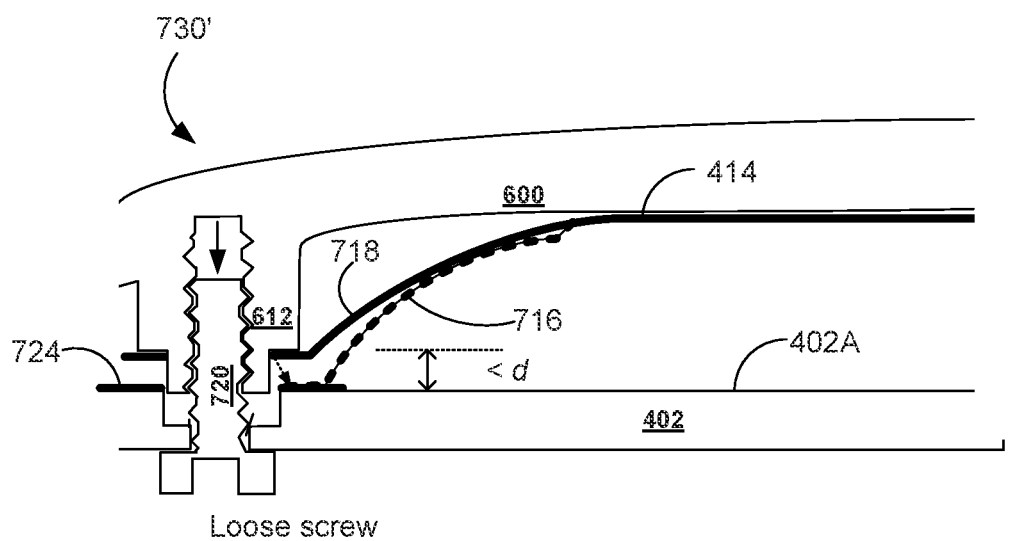
Figure 7E:
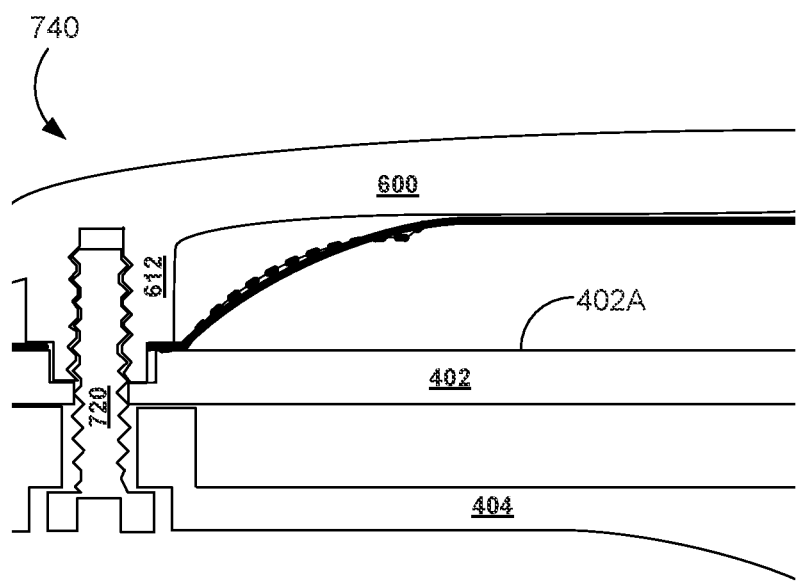
FIG. 7E is another example cross sections of a voice-activated electronic device including a touch sensor in accordance with some implementations.
Figure 7F:
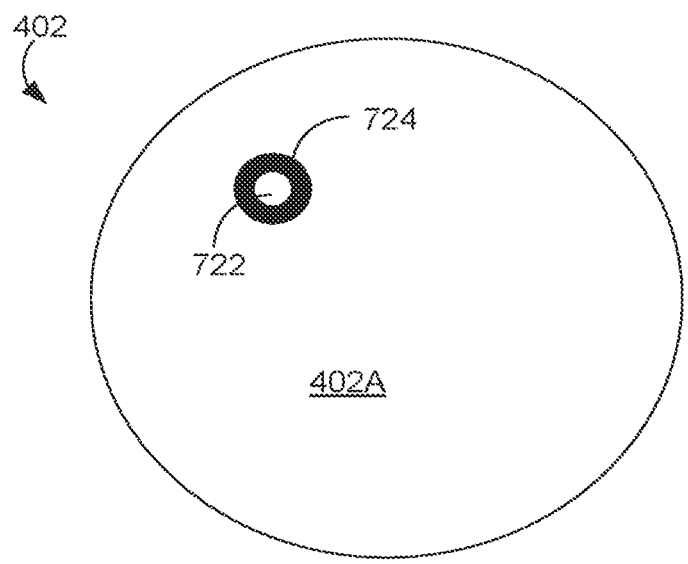
FIG. 7F illustrates an example PCB having a receiving hole and a conductive area in accordance with some implementations.

FIGS. 7D-1 and 7D-2 are example cross sections 730 and 730' of a voice-activated electronic device 104 including a touch sensor shown in accordance with some implementations, and FIG. 7F illustrates an example PCB 402 having a receiving hole 722 and a conductive area 724 in accordance with some implementations. After the touch sensor 414 is coupled to an upper interior surface 600 of an upper portion 306, the upper portion 306 is further coupled to a PCB 402 via a fastener 720. The fastener 720 configured to be mechanically coupled to the boss structure 612 of the upper portion 306. Specifically, the PCB 402 has a first surface 402A and one or more receiving holes 722. The first surface 402A faces the upper interior surface 600 of the housing and includes a conductive area 724 surrounding each receiving hole 722. An opening 706 of the contact portion 606 of the touch sensor 414 and a the boss structure 612 are configured to be aligned with the receiving hole 722 of the PCB 402. A central shank 710 of the boss structure 612 is configured to be received by both the opening 706 of the touch sensor and the receiving hole 722 of the PCB 402. When the fastener 720 is coupled to the screw hole 714, both the PCB 402 and the contact ring 708 of the touch sensor 414 are held between a flat recessed periphery 712 of the buss structure 612 and a head of the fastener 720. Specifically, the PCB 402 is pushed by the fastener 720 to press onto the contact ring 708 sitting on the flat recessed periphery 712. As a result, the conductive area 724 surrounding the receiving hole 722 of the PCB 402 comes into contact with the contact ring 708, forming an electrically conductive path between the touch sensor 414 and the PCB 402.

A spring finger 716 of the contact portion 606 is separated from an arm 718 coupled to the contact ring 708 and has a bending curvature greater than that of the arm 718. In the natural state (FIG. 7B), the spring finger 716 deflects from the arm 718 of the contact portion 606 and does not contact the flat recessed periphery 712. When the fastener 720 is applied to couple the PCB 402 to the boss structure 612, a tip area of the spring finger 716 touches the first surface 402A of the PCB 402 and comes into contact with the conductive area 724 of the PCB 402. By these means, the conductive area 724 surrounding the receiving hole 722 of the PCB 402 comes into contact with both the tip area of the spring finger 716 and the contact ring 708 that are separable from each other, forming two separate conductive paths between the touch sensor 414 and the PCB 402. Under some circumstances, the fastener 720 is loosened from the boss structure of the housing to cause the contact ring 708 to be electrically decoupled from the conductive area 724 of the PCB 402, particularly because touches constantly occur on an exterior surface of the upper portion 306 corresponding to the touch sensor 414 for an extended duration of time. When the fastener 720 becomes loose, the contact between the contact ring 708 and the conductive area 724 may be compromised (e.g., not consistent any more). The tip area of the spring finger 716 is configured to be controlled by a stiffness of the spring finger to contact the conductive area 724 of the PCB 402 and maintain its corresponding conductive path between the touch sensor 414 and the PCB 402 when the fastener 720 becomes loose.

Referring to FIG. 7D-1, the central shank 710 of the boss structure 612 is configured to fit in both the opening 706 of the touch sensor 414 and the receiving hole 722 of the PCB 402, and to mate to the fastener 720 to couple the touch sensor 414 between the upper interior surface 600 and the PCB 402. The receiving hole 722 of the PCB 402 is configured to have a diameter less than a diameter of a head 720A of the fastener 720 and greater than an outer diameter of the central shank 710 of the boss structure 612 of the housing. Also, the opening 706 of the contact portion 606 of the touch sensor 414 is configured to have a diameter greater than an outer diameter of the central shank 710 of the boss structure 612 of the housing and less than an outer diameter of the conductive area 724 of the PCB 402 and an outer diameter of the flat recessed periphery 712.

Referring to FIG. 7D-1, in some implementations, the central shank 710 of the boss structure 612 has a length that is shorter than a thickness of the PCB 402. When the fastener 720 is fastened to the boss structure 612, the boss structure 612 sits in the receiving hole 722 of the PCB and does not rise out of the receiving hole 722. Optionally, the receiving hole 722 of the PCB 402 has a single diameter through its entire thickness. Optionally, the receiving hole 722 of the PCB 402 has a first diameter for a first portion of a thickness of the PCB and a second diameter for a second portion of the thickness of the PCB. The first diameter is less than a diameter of the head 720A of the fastener 720 to block the head 720A of the fastener 720. Optionally, a diameter of the boss structure 612 is greater than the first diameter and less than the second diameter of the one of the receiving holes.

In some implementations, one or more of the conductive area 724 on the PCB 402, the contact ring 708 and the tip area of the spring finger 716 is coated with a conductive material (e.g., gold, copper) having a resistivity lower than a resistivity threshold to improve contact of the conductive area 724 on the PCB 402 with the contact ring 708 or the tip area of the spring finger 716.

In some implementations, when the fastener 720 is coupled tightly into the screw hole of the boss structure 612 (FIG. 7D-1), each of the contact ring 708 and the tip of the spring finger 716 is coupled between the conductive area 724 of the PCB 402 and the fat recessed periphery 712 of the boss structure 612, and remains in contact with both of them. When the fastener 720 is loosened from the boss structure 612 (FIG. 7D-2), the contact ring 708 is physically and electrically decoupled from the conductive area 724 of the PCB 402. The tip area of the spring finger 716 is configured to be controlled by a stiffness of the spring finger 716 to contact the conductive area 724 of the PCB 402 and maintain a corresponding conductive path between the touch sensor 414 and the PCB 402. However, a shift of the PCB 402 caused by the loose fastener 720 is less than the deviation of d at the tip area of the spring finger 716 in FIG. 7B.

FIG. 7E is another example cross section 740 of a voice-activated electronic device 104 including a touch sensor shown in FIGS. 7A and 7B in accordance with some implementations. In some implementations, after the touch sensor 414 is coupled to the upper interior surface 600, the upper portion 306 is further coupled to both the PCB 402 and the waveguide 404 by the fastener 720. The fastener 720 is configured to be mechanically coupled to the boss structure 612. That said, the waveguide 406 has a receiving hole aligned with the receiving hole 722 of the PCB 402, the contact ring 708 and opening 706 of the touch sensor 414, and the boss structure 612. When the fastener 720 is coupled to the screw hole 714 of the boss structure 612, the waveguide 404 is tightly held between the flat recessed periphery 712 and the head 720A of the fastener 720 with the contact ring 708 of the touch sensor 414 an the PCB 402. In some implementations, the central shank 710 of the boss structure 612 has a length that is longer than the thickness of the PCB 402. When the fastener 720 is fastened to the boss structure 612, the boss structure 612 passes through the receiving hole 722 of the PCB and enters a receiving hole of the waveguide 404, but does not rise out of the receiving hole of the waveguide 404.

Figure 7G:
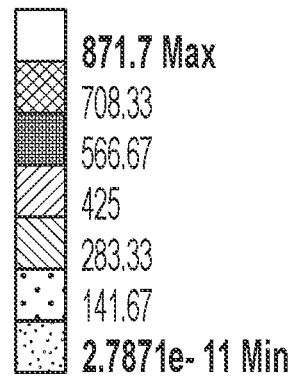
FIG. 7G is an example stress distribution diagram of an example touch sensor that is assembled in a voice-activated electronic device shown in FIGS. 7D-1 and 7E in accordance with some implementations.
Figure 7G:
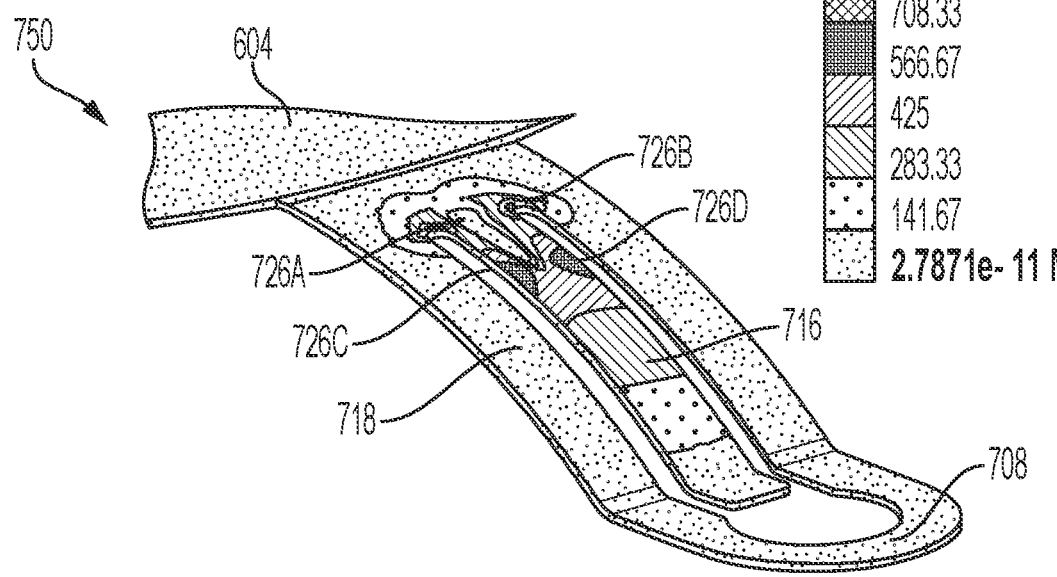

FIG. 7G is an example stress distribution diagram 750 of an example touch sensor 414 that is assembled in a voice-activated electronic device 104 (i.e., in a stressed state) shown in FIGS. 7D and 7E in accordance with some implementations. In a natural state (FIG. 7B), before the PCB 402 is assembled, the contact ring 708 comes into contact with the flat recessed periphery 712 of the boss structure 612, and the spring finger 716 deflects from the arm 718 of the contact portion 606 and does not contact the flat recessed periphery 712. In a stressed state, after the PCB 402 is assembled, the contact ring 708 is held between the flat recessed periphery 712 of the boss structure 612 and the first surface 402A of the PCB 402, forming electrically conductive path between the touch sensor 414 and the PCB 402, and the spring finger 716 also comes into contact with the conductive area 724 of the PCB 402 and is pushed thereby to the arm 718 of the contact portion 606. As such, a stiffness and bending curvature of the spring finger in the natural state are configured to create a force in a target force range when the contact portion 606 is electrically coupled to the corresponding conductive area 724 on the PCB 402 via the contact ring 708 and the tip area of the spring finger 716. Referring to FIG. 7E, when both the spring finger 716 and the contact ring 708 are electrically coupled to the conductive area 724 of the PCB 402 (i.e., in a stressed state), the spring finger 716 is stressed to adopt a curvature of the arm 718 and has a plurality of stress points 726 (e.g., points 726A and 726B at an intersection where the spring finger 716 starts, points 726C and 726D on two edges of the spring finger 716).

Figure 8A:
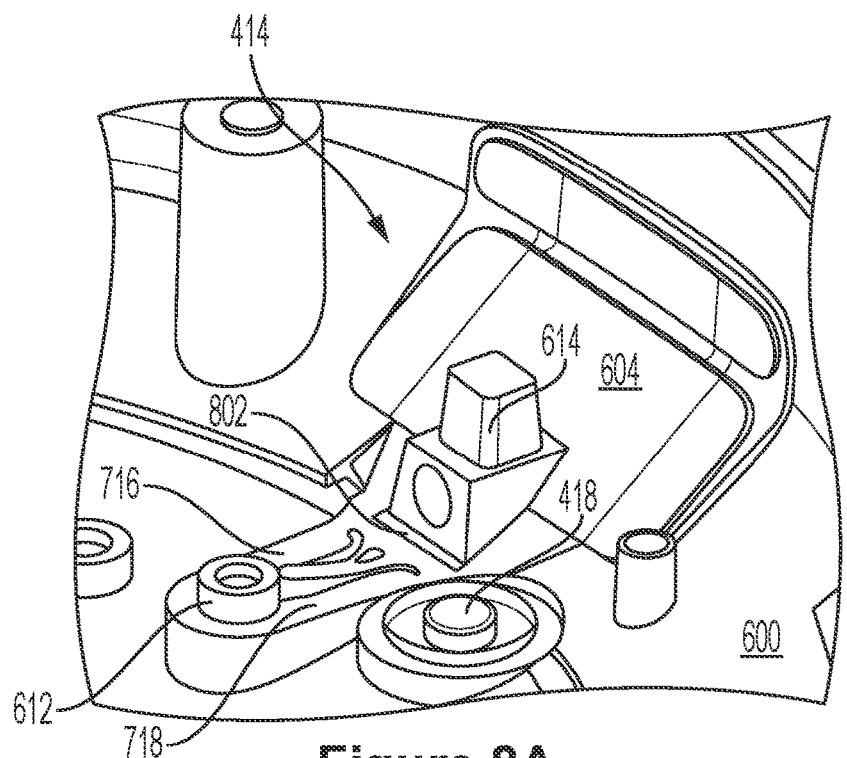
FIG. 8A illustrates another example touch sensor disposed in proximity to an upper interior surface of a voice-activated electronic device in accordance with some implementations.
Figure 8B:
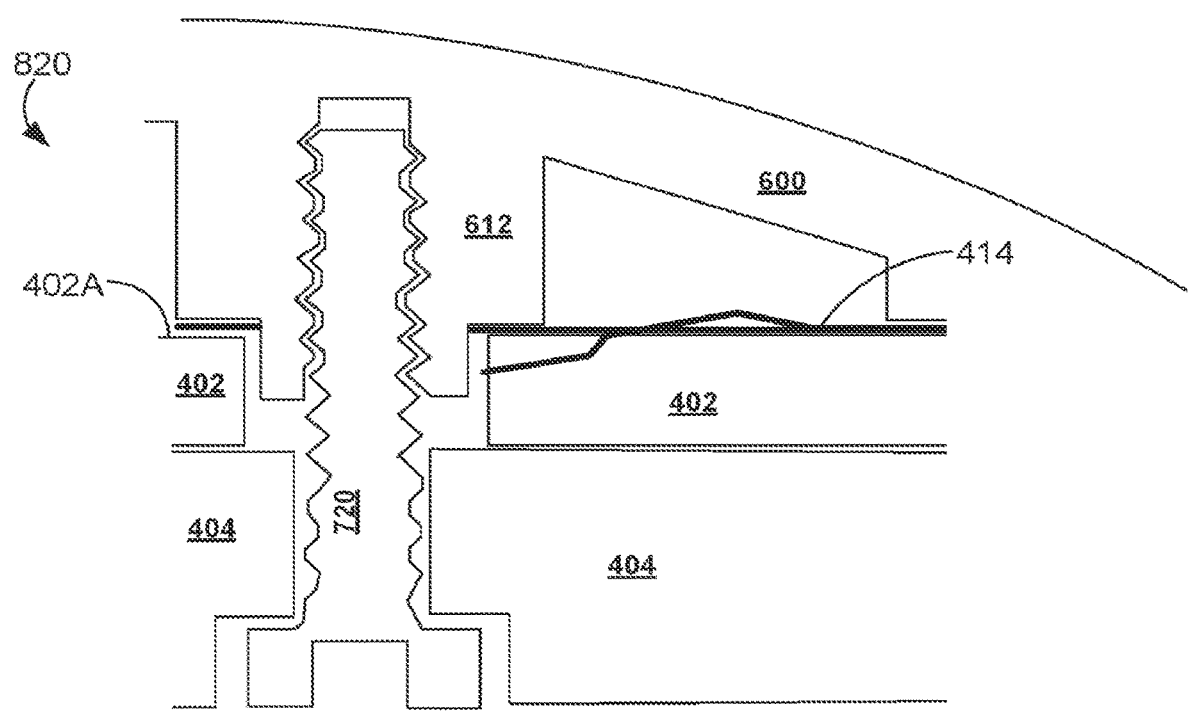
FIG. 8B is a cross sectional view of a voice-activated electronic device including a touch sensor shown in FIG. 8A in accordance with some implementations.
Figure 8C:
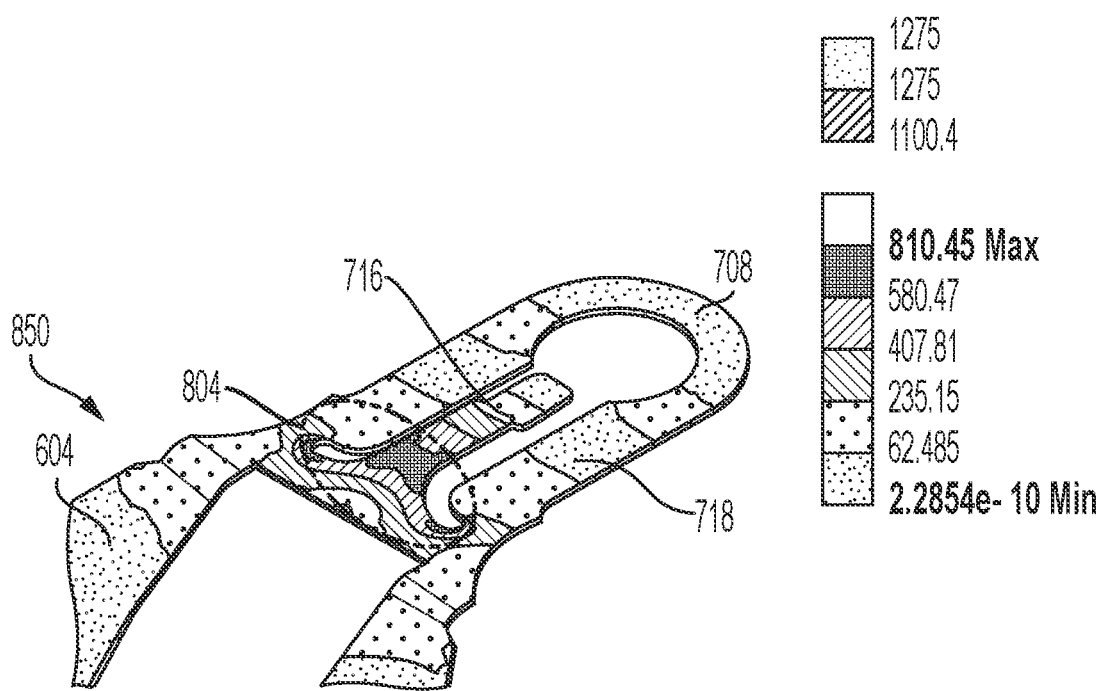
FIG. 8C is an example stress distribution diagram of an example touch sensor that is assembled in a voice-activated electronic device shown in FIG. 8B in accordance with some implementations.

FIG. 8A illustrates another example touch sensor 414 disposed in proximity to an upper interior surface 600 of a voice-activated electronic device 104 in accordance with some implementations. More specifically, the touch sensor 414 is disposed next to a peripheral wall of the upper portion 306 of the electronic device 104. FIG. 8B is a cross sectional view 820 of a voice-activated electronic device 104 including a touch sensor 414 shown in FIG. 8A in accordance with some implementations. FIG. 8C is an example stress distribution diagram 850 of an example touch sensor 414 that is assembled in a voice-activated electronic device 104 (i.e., in a stressed state) shown in FIG. 8B in accordance with some implementations. The touch sensor 414 includes a sensing portion 604 and a contact portion 606 extending from the sensing portion 604. In this example, the sensing portion 604 has a planar or non-planar shape that is conformal to a shape of the upper interior surface 600 locally at a peripheral sensor area 602. When it is disposed in proximity to the peripheral sensor area 602, the sensing portion 604 comes into contact with the peripheral sensor area 602 or is separated by a substantially small gap from the peripheral sensor area 602. As such, the sensing portion 604 is configured to detect a touch on a corresponding area of an upper exterior surface of the housing corresponding to the peripheral sensor area 602.

The sensing portion 604 of the touch sensor 414 has at least one cutout opening 802 configured to receive a light guide 614. The light guide 616 rises from the upper interior surface 600 when the touch sensor 414 is disposed in proximity to the upper interior surface 600. A size of the cutout opening 802 matches a size of the light guide 614. When the light guide 614 is coupled in the cutout opening 802, the sensing portion 604 can be automatically aligned with a boss structure 612 fixed on the upper interior surface 600. The cutout opening 802 optionally has a shape that is consistent with or distinct from a shape of the light guide 616. In some implementations, a plurality of LEDs are mounted on the PCB 402. When the fastener 720 couples the PCB 402 to the boss structure 612, the plurality of LEDs are automatically aligned with the light guide array 610 and the light guides 614 and 616. Light generated by these LEDs are guided to the upper interior surface 600 to be visible to the outside. In some implementations, a first visual pattern enabled by the one or more light guides 610 indicates a voice processing status of the electronic device 104. A second visual pattern enabled by the second light guide 614 indicates a location of the corresponding touch sensor 414, and is configured to guide a user of the electronic device 104 to touch on a correct location for the purposes of activating one or more predetermined functions (e.g., increasing a volume, decrease a volume).

Alternatively, in some implementations not shown in FIG. 8A, the light guide 614 does not rise out of the opening 802 of the touch sensor 414. Rather, the light guide 616 is disposed in proximity and next to the touch sensor 414, and is configured to receive light emitted by the LED mounted on the PCB and provide illumination via an LED opening on the housing to indicate the corresponding location on the exterior surface of the housing to which the touch sensor 414 is adjacent.

The contact portion 606 extends from an edge of the sensing portion 604, and has an opening 706 located near its tip area and a contact ring 708 in which the opening 706 is defined. When the touch sensor 414 is so disposed to allow the light guide 616 to rise out of a corresponding opening 802, the opening 706 of the contact portion 606 is automatically aligned with the boss structure 612 fixed on the upper interior surface 600, and the boss structure 612 at least partially rises out of the opening 706 of the contact portion 606. The contact portion 606 further includes a spring finger 716 physically separated from the contact ring 708 and an arm 718 that connects to the contact ring 708. The spring finger 716 is bent out of a plane of the contact portion 606, and deviated further away from a plane of the sensing portion 604 compared with the arm 718. Optionally, the arm 718 is substantially planar (i.e., flat). In some implementations, the spring finger 716 is physically modified to result in the second stiffness or the second bending curvature of the spring finger 716. For example, the spring finger 716 may be bent with an angle at its intersection with the arm 718. Alternatively, a thickness of the spring finger 716 may be adjusted at its intersection 732 with the arm 718, e.g., by placing one or more beads on a rear end of the spring finger 716 near its intersection 732 with the arm 718.

It is noted that in some implementations, the contact ring 708 and a tip area of the spring finger 716 are bent or flattened with respect to bodies of the arm 718 and the spring finger 716 according to a shape of the flat recessed periphery 712 of the boss structure 612, thereby configuring the contact ring 708 and the tip area of the spring finger 716 to come into close contact with the flat recessed periphery 712. In a natural state shown in FIG. 8A, before the PCB 402 is assembled, the contact ring 708 comes into contact with the flat recessed periphery 712 of the boss structure 612, and the spring finger 716 deflects from the arm 718 of the contact portion 606 and does not contact the flat recessed periphery 712. In a stressed state, after the PCB 402 is assembled, the contact ring 708 is held between the flat recessed periphery 712 of the boss structure 612 and the first surface 402A of the PCB 402, forming electrically conductive path between the touch sensor 414 and the PCB 402, and the spring finger 716 also comes into contact with the conductive area 724 of the PCB 402 and is pushed thereby to the arm 718 of the contact portion 606. Under some circumstances, the fastener 720 is loosened from the boss structure 612 to cause the contact ring 708 to be electrically decoupled from the conductive area 724 of the PCB 402. This often happens when touches constantly occur on an exterior surface of the upper portion 306 corresponding to the touch sensor 414 for an extended duration of time. The tip area of the spring finger 716 is configured to be controlled by a stiffness of the spring finger 716 to contact the conductive area 724 of the PCB 402 and maintain a corresponding conductive path between the touch sensor 414 and the PCB 402.

In some implementations, the stiffness and bending curvature of the spring finger in the natural state are configured to create a force in a target force range when the contact portion 606 is electrically coupled to the corresponding conductive area 724 on the PCB 402 via the contact ring 708 and the tip area of the spring finger 716. Referring to FIG. 8C, when both the spring finger 716 and the contact ring 708 are electrically coupled to the conductive area 724 of the PCB 402 (i.e., in a stressed state), the spring finger 716 is stressed to adopt a curvature of the arm 718 and has a plurality of stress regions 804 near an intersection 732 where the spring finger 716 starts to separate from the arm 718.

Controlled Sound Path Crossing an Acoustically Porous Cover

Figure 9A:
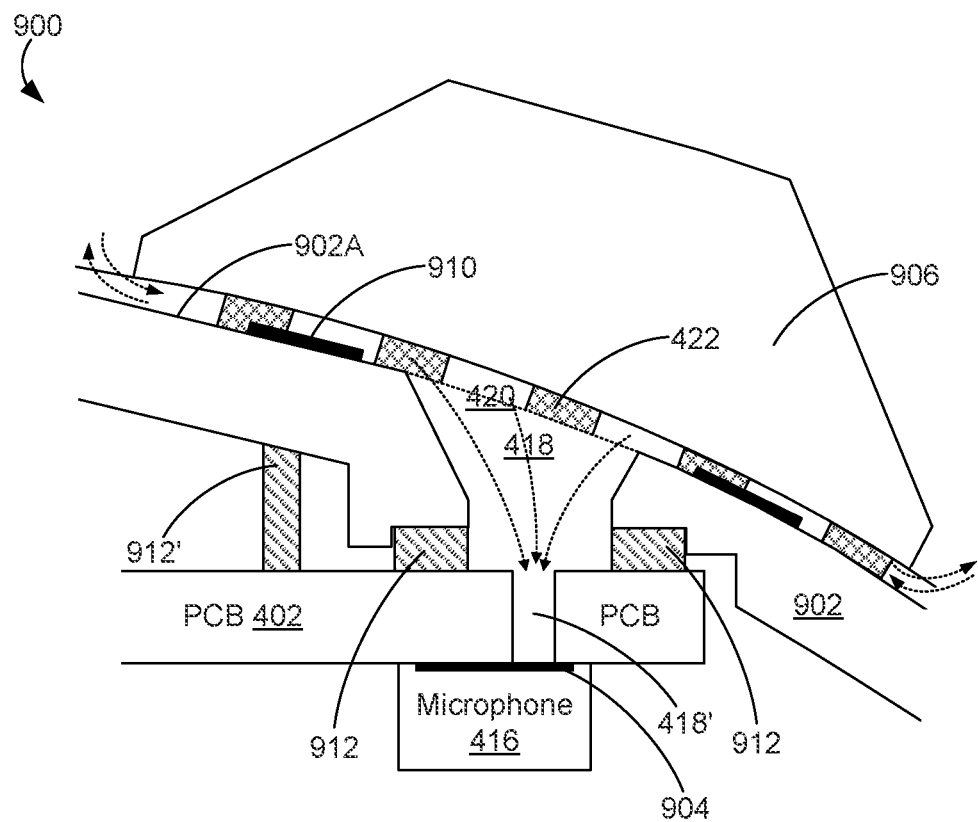
FIGS. 9A and 9B are a cross sectional view and a top view of a region of a voice-activated electronic device in which a microphone is disposed in accordance with some implementations, respectively.
Figure 9B:
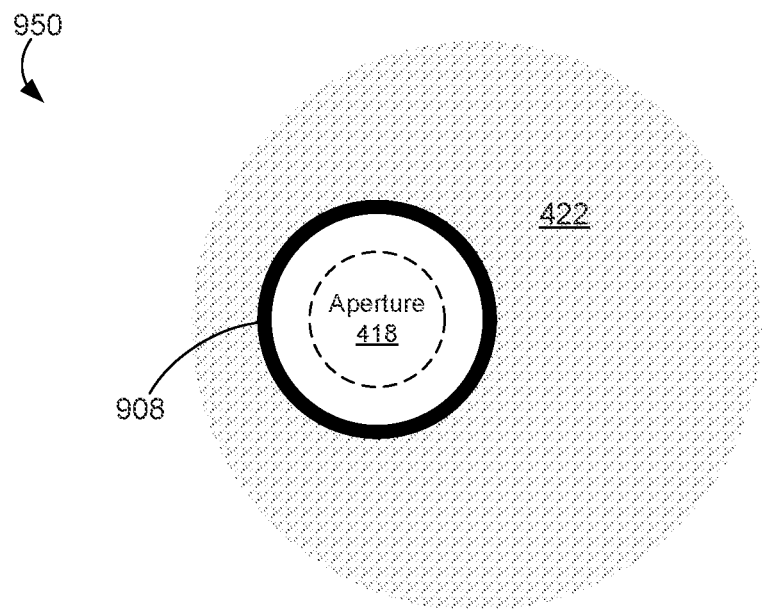

FIGS. 9A and 9B are a cross sectional view 900 and a top view 950 of a region of a voice-activated electronic device 104 in which a microphone 416 is disposed in accordance with some implementations, respectively. The electronic device 104 has a housing 902 and one or more microphones 416 enclosed in the housing 902. The housing 902 has an exterior surface 902A and a first microphone aperture 418. The microphone 416 has a diaphragm 904 facing the first microphone aperture 418. The diaphragm 904 of the microphone 416 is configured to receive incoming sound via the first microphone aperture 418, such that the microphone 416 can convert the incoming sound to an electrical signal. Before the electronic device 104 is shipped out of factory, at least part of the exterior surface of housing 902 (e.g., an upper portion 306) is wrapped by an acoustically porous cover 422 to provide a clean look. The first microphone aperture 418 is therefore concealed by the acoustically porous cover 422.

During the course of calibrating the microphone 416, a microphone testing fixture 906 is disposed in contact with the acoustically porous cover 422 to deliver testing sound signals into the first microphone aperture 418. The test sound signals cannot be delivered entirely into the microphone, because part of the test sound signals are leaked from an edge at an interface of the microphone testing fixture 906 and the acoustically porous cover 422. Also, due to leakage at the edge of this interface, sound signals collected by the microphone 416 do not entirely come from the microphone testing fixture 906. Noise signals in an ambient enter the housing 902 via the edge and interfere with the test sounds signals provided by the microphone testing fixture 906. As such, the edge has to be substantially sealed at an interface of the microphone testing fixture 906 and the acoustically porous cover 422 to provide a desirable sound delivery efficiency without compromising the clean look of the electronic device 104.

In various implementations of this application, the exterior surface 902A of the housing 902 includes a sealing area 908 surrounding but not including the first microphone aperture 418, and the acoustically porous cover 422 is affixed to the sealing area 908 of the exterior surface 902A via an adhesive 910. The adhesive 910 covers the sealing area 908 and permeates a thickness of the acoustically porous cover 422 above the sealing area, thereby enabling formation of a controlled sound path to the microphone 416 by coupling of a microphone testing fixture 906 to a region of the acoustically porous cover 422 corresponding to the sealing area 908. In some implementations, the adhesive 910 is configured to be applied on the sealing area 908 of the housing 902 and covered by the acoustically porous cover 422. The adhesive 910 permeates the thickness of the acoustically porous cover 422 and is hardened in response to heat treatment under a predetermined condition. Preferably, the adhesive 910 permeates part of the thickness of the acoustically porous cover 422, rather than an entire thickness, such that the adhesive is not visible or felt by touch from the exterior surface of the acoustically porous cover 422. In some implementations, the acoustically porous cover 422 is flexible and substantially transparent to audible sound. Referring to FIG. 9B, in an example, the sealing area 908 includes a circular ring area enclosing the first microphone aperture 418.

In some implementations, the sealing area 908 is defined according to a shape and a dimension of the microphone testing fixture 906. When the microphone testing fixture 906 is disposed in contact with the acoustically porous cover 422, the acoustically porous cover 422 is deformed, and the deformed cover 422 and the adhesive 910 are configured to substantially cut off any leakage at the edge of the interface of the microphone testing fixture 906 and the acoustically porous cover 422. That said, in an example, when the microphone testing fixture 906 is coupled to the controlled sound path, a portion of sound generated by the microphone testing fixture 906 is collected by the microphone 416. In accordance with desirable sound delivery efficiency, the portion of sound is greater than a predetermined portion (e.g., 90%) of the sound generated by the microphone testing fixture 906. Alternatively, from another perspective, when the microphone testing fixture 906 is coupled to the controlled sound path, a portion of sound collected by the microphone 416 comes from an ambient source other than the microphone testing fixture 906. In accordance with desirable sound delivery efficiency, the portion of sound is less than a predetermined portion (e.g., 20%) of the sound collected by the microphone 416.

In some implementations, the microphone 416 is disposed at a predetermined location with reference to the microphone testing fixture 906 while the microphone testing fixture 906 is not pressed onto the exterior surface of the housing 902. The microphone testing fixture 906 sweeps through frequencies in a tone range, and a first frequency response is recorded at the microphone 416. The microphone testing fixture 906 is then pressed onto the first microphone aperture 418 of the housing 902. The microphone testing fixture 906 sweeps through frequencies in the tone range again, and a second frequency response is recorded at the microphone 416. The second frequency response is compared with the first frequency response to determine whether the interface of the microphone testing fixture 906 and the acoustically porous cover 422 (also called the cover-fixture interface) can provide a desirable sound delivery efficiency. In some implementation, a difference of the first and second frequency responses is greater than a predetermined attenuation threshold (e.g., 10 dB) to provide the desirable sound delivery efficiency. A direct outcome of failing to provide the desirable sound delivery efficiency is that the microphone 416 cannot detect hotwords effectively (e.g., misses 50% of the hotwords) in a smart home environment where the electronic device 104 is located.

In some implementations, a PCB 402 is enclosed in the housing 902 and has a first surface 402A facing an interior surface 902A of the housing 902, a second surface 402B opposing the first surface 402A, and a second microphone aperture 418' aligned with the first microphone aperture 418 of the housing 902. The microphone 416 is coupled to the second surface 402B of the PCB 402, and the diaphragm 904 of the microphone 416 faces the second microphone aperture 418' of the PCB 402 directly. The diaphragm 904 of the microphone 416 is configured to receive sound via the second microphone aperture 418' of the PCB 402. A sound control structure 912 or 912' is coupled to the interior surface of the housing and the first surface 402A of the PCB 402. The sound control structure 912 or 912' forms a sound channel connecting the first microphone aperture 418 of the housing 902 and the second microphone aperture 418' of the PCB 402 and extending to the controlled sound path 420 that passes across the acoustically porous cover 422. Further, in some implementations, the sound control structure 912 includes a hollow cylinder that is concentric with the sealing area 908 on the exterior surface 902A of the housing 902 and the controlled sound path 420 that passes across the acoustically porous cover 422.

Alternatively, in some implementations, the microphone 416 is disposed on the first surface 402A of the PCB 402 and faces the interior surface of the housing 902. The sound control structure 912 is coupled to the interior surface of the housing 902 and the microphone 416, and forms a sound channel connecting the first microphone aperture 418 of the housing 902 and the microphone 416 and extending to the controlled sound path 420 that passes across the acoustically porous cover 422.

Figure 10A:
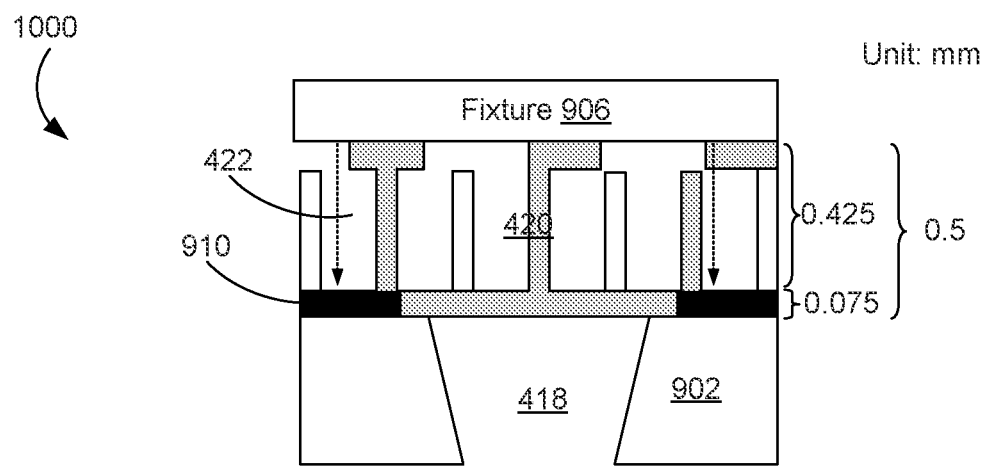
FIGS. 10A-10C are enlarged cross sectional views of example microphone aperture areas of a voice-activated electronic device in accordance with some implementations.
Figure 10B:
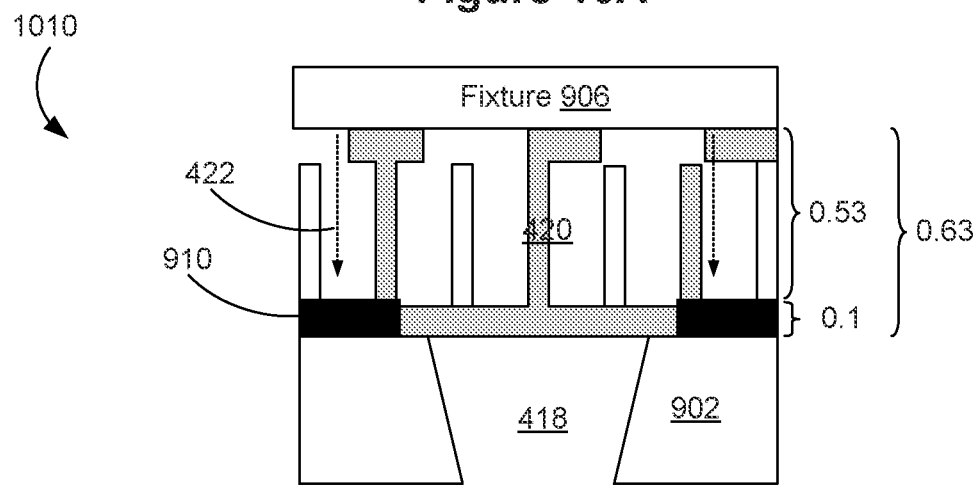
Figure 10C:
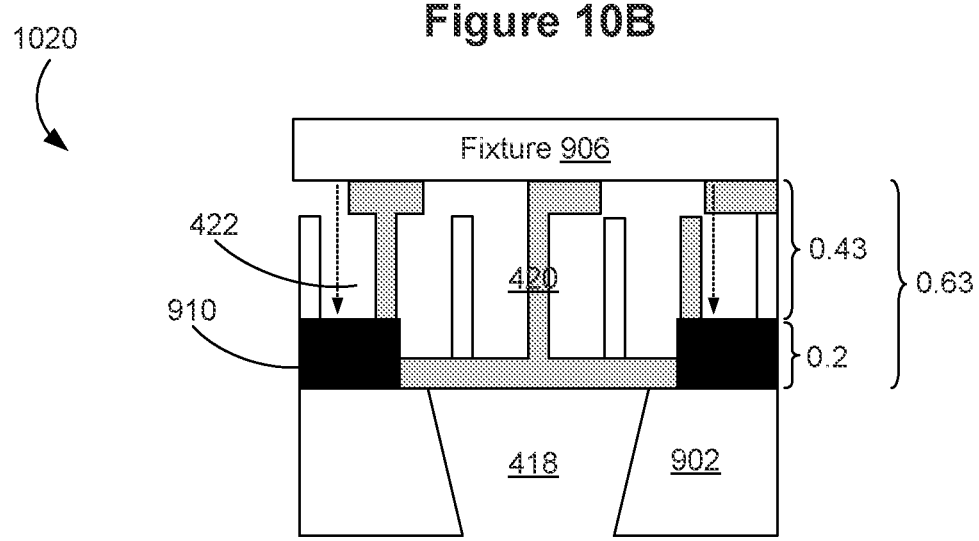

FIGS. 10A-10C are enlarged cross sectional views of example microphone aperture areas 1000, 1010 and 1020 of a voice-activated electronic device 104 in accordance with some implementations. In some implementations, the adhesive 910 is configured to be applied on the sealing area 908 of the housing 902 and covered by the acoustically porous cover 422. Preferably, the adhesive 910 permeates part of the thickness of the acoustically porous cover 422, rather than an entire thickness, such that the adhesive is not visible or felt by touch from the exterior surface of the acoustically porous cover 422. During the course of calibrating the microphone 416, the adhesive 910 permeates at least a predetermined portion of the entire thickness of the acoustically porous cover 422, and the microphone testing fixture 906 is configured to be pressed onto the region of the acoustically porous cover 422 corresponding to the sealing area 908 to compress microcavities in part of the acoustically porous cover 422 that is not permeated with the adhesive 910, thereby enabling formation of the controlled sound path 420 of the microphone 416.

Each of the microphone aperture areas 1000, 1010 and 1020 has a respective thickness of the acoustically porous cover 422 and a respective predetermined portion of the thickness of the cover 422. The acoustically porous cover 422 made of a thicker textile/fabric demands a larger compression force from the microphone testing fixture 906 to properly seal an interface between them. It is also desirable to increase a thickness of the adhesive 910 (i.e., the respective determined portion). The adhesive 910 is often transformed after being applied onto the sealing area 908, and the thickness of the adhesive 910 should not exceed the thickness of the acoustically porous cover 422 before or after the adhesive is transformed. If the thickness of the adhesive 910 exceeds the thickness of the acoustically porous cover 422 prior to transformation, the adhesive 910 may leave a trace on the region of the acoustically porous cover 422 corresponding to the sealing area 908 after transformation, thereby compromising the clean look of the electronic device 104. If the thickness of the adhesive 910 exceeds the thickness of the acoustically porous cover 422 after transformation, the adhesive 910 is visible and comprises the clean look of the electronic device 104 directly. As such, the thickness of the adhesive 910 is preferred to be increased to fill the fabric (i.e., the microcavities in the fabric) of the acoustically porous cover 422 for improving sealing of the cover-fixture interface while maintaining the clean look of the electronic device 104.

Referring to FIG. 10A, the acoustically porous cover 422 in the microphone aperture area 1000 corresponds to a first type of fabric material. The thickness of the acoustically porous cover 422 is approximately equal to 0.5 mm, and the portion of the thickness filled with the adhesive 910 is approximately equal to 0.075 mm. The microphone aperture area 1000 passes a microphone seal test involving the microphone testing fixture 906, and has a clean look from its exterior surface of the housing 902. That said, for the acoustically porous cover 422 made of the first type of fabric material, a combination of a cover thickness of 0.5 mm and an adhesive thickness of 0.075 mm enables a desirable sound delivery efficiency while keeping the clean look of the electronic device 104.

Referring to FIGS. 10B and 10C, the acoustically porous cover 422 in the microphone aperture areas 1010 and 1020 corresponds to a second type of fabric material that is distinct from the first type of material. In the microphone aperture area 1010, the thickness of the acoustically porous cover 422 is approximately equal to 0.63 mm, and the portion of the thickness filled with the adhesive 910 is approximately equal to 0.1 mm. The microphone aperture area 1010 failed a microphone seal test, because the cover-fixture interface is leaky and the portion of sound collected by the microphone 416 does not reach a predetermined portion (e.g., 90%) of sound generated by the microphone testing fixture 906. In contrast, in the microphone aperture area 1020, the thickness of the acoustically porous cover 422 is approximately equal to 0.63 mm, and the portion of the thickness filled with the adhesive 910 is approximately equal to 0.2 mm, allowing the microphone aperture area 1020 to pass the microphone seal test. As such, for the acoustically porous cover 422 made of the second type of fabric material, a combination of a cover thickness of 0.63 mm and an adhesive thickness of 0.2 mm (not 0.1 mm) enables a desirable sound delivery efficiency while keeping the clean look of the electronic device 104.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

Clause 1. An electronic device, comprising:
  a housing having an exterior surface and an aperture;
  a microphone enclosed in the housing and having a diaphragm, wherein the diaphragm of the microphone faces the aperture and is configured to receive sound via the aperture; and
  an acoustically porous cover at least partially covering the exterior surface of the housing, wherein the acoustically porous cover conceals the aperture of the housing;
  wherein the exterior surface of the housing includes a sealing area surrounding but not including the aperture, and the acoustically porous cover is affixed to the sealing area of the exterior surface via an adhesive;
  wherein the adhesive covers the sealing area and permeates a thickness of the acoustically porous cover above the sealing area, thereby enabling formation of a controlled sound path to the microphone by coupling of a microphone testing fixture to a region of the acoustically porous cover corresponding to the sealing area.

Clause 2. The electronic device of clause 1, wherein the aperture of the housing includes a first aperture, further comprising:
  a printed circuit board (PCB) that is enclosed in the housing and has a first surface facing an interior surface of the housing, a second surface opposing the first surface, and a second aperture aligned with the first aperture of the housing, wherein the microphone is coupled to the second surface of the PCB, and the diaphragm of the microphone faces the second aperture of the PCB directly and is configured to receive sound via the second aperture of the PCB; and
  a sound control structure coupled to the interior surface of the housing and the first surface of the PCB, wherein the sound control structure forms a sound channel connecting the first aperture of the housing and the second aperture of the PCB and extending to the controlled sound path that passes across the acoustically porous cover.

Clause 3. The electronic device of clause 1 or 2, wherein the sound control structure includes a hollow cylinder that is concentric with the sealing area on the exterior surface of the housing and the controlled sound path that passes across the acoustically porous cover.

Clause 4. The electronic device of any of the preceding clauses, wherein the aperture of the housing includes a first aperture, further comprising:
  a sound control structure coupled to the interior surface of the housing and the microphone, wherein the sound control structure forms a sound channel connecting the first aperture of the housing and the microphone and extending to the controlled sound path that passes across the acoustically porous cover.

Clause 5. The electronic device of clause 4, further comprising:
  a printed circuit board (PCB) that is enclosed in the housing and has a first surface facing an interior surface of the housing, wherein the microphone is mounted on the first surface of the PCB, and the diaphragm of the microphone faces the first aperture of the housing directly.

Clause 6. The electronic device of any of the preceding clauses, wherein the acoustically porous cover is flexible and substantially transparent to audible sound.

Clause 7. The electronic device of any of the preceding clauses, wherein:
  the controlled sound path in the acoustically porous cover is configured to match a dimension of the microphone testing fixture and guide sound generated by the microphone towards the microphone testing fixture;
  when the microphone testing fixture is coupled to the controlled sound path, a portion of sound generated by the microphone testing fixture is collected by the microphone; and
  the portion of sound is greater than a predetermined portion of the sound generated by the microphone testing fixture.

Clause 8. The electronic device of any of the preceding clauses, wherein the adhesive is not visible from an external surface of the acoustically porous cover.

Clause 9. The electronic device of any of the preceding clauses, wherein the adhesive is configured to be applied on the sealing area of the housing and covered by the acoustically porous cover, and the adhesive permeates the thickness of the acoustically porous cover and is hardened in response to heat treatment under a predetermined condition.

Clause 10. The electronic device of any of the preceding clauses, wherein the adhesive permeates at least a predetermined portion of an entire thickness of the acoustically porous cover, and the microphone testing fixture is configured to be pressed onto the region of the acoustically porous cover to compress microholes in part of the entire thickness of the acoustically porous cover that is not permeated with the adhesive, thereby enabling formation of the controlled sound path of the microphone.

Clause 11. The electronic device of any of the preceding clauses, wherein the sealing area includes a circular ring area.

What is claimed is:

1. An electronic device, comprising:
  a housing;
  a microphone within an interior of the housing;
  a first microphone aperture defined by the housing that directs sound from outside the housing to the microphone;
  a cover having a first surface; and
  an adhesive ring on an exterior surface of the housing around the first microphone aperture that attaches the first surface of the cover to the exterior surface of the housing.

2. The electronic device of claim 1, wherein the adhesive ring does not attach with the housing overlapping the first microphone aperture.

3. The electronic device of claim 1, wherein the adhesive ring is a circular ring.

4. The electronic device of claim 1, further comprising:
  a printed circuit board (PCB) having a first side and a second side, the PCB housed by the housing, and attached with the microphone.

5. The electronic device of claim 4, wherein:
  the PCB defines a second microphone aperture that passes from the first side of the PCB to the second side of the PCB, the first side of the PCB being closer to the first microphone aperture than the second side of the PCB.

6. The electronic device of claim 5, wherein the microphone is attached with the second side of the PCB.

7. The electronic device of claim 6, further comprising a sound control structure that forms a sound channel connecting the first microphone aperture and the second microphone aperture.

8. The electronic device of claim 4, further comprising a speaker housed by the housing.

9. The electronic device of claim 8, further comprising waveguide that directs sound from the speaker to outside the housing, wherein the PCB is disposed on a top surface of the waveguide.

10. The electronic device of claim 9, wherein the housing comprises an upper portion and a base portion, the upper portion comprising a plurality of perforations to allow for transmission on sound waves.

11. The electronic device of claim 1, wherein the adhesive ring permeates a predefined thickness of the cover extending from the first surface and less than an entire thickness of the cover.

12. The electronic device of claim 8, wherein the cover comprises fabric.

13. The electronic device of claim 1, wherein the electronic device is an assistant device that causes activities to be performed in response to natural language voice commands.

14. The electronic device of claim 1, further comprising:
a second microphone within the housing;
a third microphone aperture defined by the housing that directs sound from outside the housing to the second microphone; and
a second adhesive ring on the housing around the third microphone aperture that attaches the cover to the housing.

15. The electronic device of claim 14, wherein the second adhesive ring does not attach with the housing overlapping the third microphone aperture.

16. The electronic device of claim 14, wherein the first microphone aperture and the third microphone aperture are on opposite sides of an upper portion of the housing.

17. The electronic device of claim 4, further comprising:
a touch sensor, coupled between the housing and the PCB, comprising a sensing portion and a contact portion extending from the sensing portion, the sensing portion:
placed in proximity to an interior surface of the housing; and
configured to detect a touch on a corresponding area of an exterior surface of the housing through the cover.

18. The electronic device of claim 17, wherein the contact portion comprises a first contact and a spring finger physically separated from the first contact, the first contact or the spring finger configured to electrically contact a conductive area on the PCB.

19. The electronic device of claim 18, wherein:
the housing further comprises a boss structure;
the first contact defines a plane; and
the spring finger extends from the contact portion beyond the plane of the first contact and towards the PCB.

20. The electronic device of claim 19, wherein a tip area of the spring finger is configured to be controlled by a stiffness of the spring finger to contact the conductive area of the PCB when the first contact is electrically coupled to the conductive area of the PCB by a fastener coupled to the boss structure of the housing.

* * * * *